(12) United States Patent
Bennahmias et al.

(10) Patent No.: US 11,335,537 B2
(45) Date of Patent: *May 17, 2022

(54) METHOD AND DEVICE FOR SPATIAL CHARGED PARTICLE BUNCHING

(71) Applicant: NexGen Semi Holding, Inc., Laguna Niguel, CA (US)

(72) Inventors: Mark Joseph Bennahmias, Mission Viejo, CA (US); Michael John Zani, Laguna Niguel, CA (US); Jeffrey Winfield Scott, Carpenteria, CA (US)

(73) Assignee: NexGen Semi Holding, Inc., Laguna Niguel, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/222,756

(22) Filed: Apr. 5, 2021

(65) Prior Publication Data
US 2022/0059319 A1    Feb. 24, 2022

Related U.S. Application Data

(63) Continuation of application No. 16/532,368, filed on Aug. 5, 2019, now Pat. No. 10,991,545, which is a
(Continued)

(51) Int. Cl.
*H01J 37/30* (2006.01)
*H01J 37/31* (2006.01)
*H01J 37/317* (2006.01)

(52) U.S. Cl.
CPC ....... *H01J 37/3007* (2013.01); *H01J 37/3174* (2013.01); *H01J 2237/04* (2013.01)

(58) Field of Classification Search
CPC . H01J 2237/04; H01J 37/3174; H01J 37/3007
(Continued)

(56) References Cited

U.S. PATENT DOCUMENTS 3,789,185 A    1/1974    Baldwin et al.
3,798,447 A    3/1974    Lanusse et al.
(Continued)

OTHER PUBLICATIONS

Ada, E. et al., "Ion beam modification and patterning of organosilane self-assembled monolayers," J. Vac. Sci. Technol. B 13 (6), Nov./Dec. 1995, pp. 2189-2196.
(Continued)

*Primary Examiner* — Nicole M Ippolito
(74) *Attorney, Agent, or Firm* — Knobbe, Martens, Olson & Bear, LLP

(57) ABSTRACT

A charged particle buncher includes a series of spaced apart electrodes arranged to generate a shaped electric-field. The series includes a first electrode, a last electrode and one or more intermediate electrodes. The charged particle buncher includes a waveform device attached to the electrodes and configured to apply a periodic potential waveform to each electrode independently in a manner so as to form a quasi-electrostatic time varying potential gradient between adjacent electrodes and to cause spatial distribution of charged particles that form a plurality of nodes and antinodes. The nodes have a charged particle density and the antinodes have substantially no charged particle density, and the nodes and the antinodes are formed from a charged particle beam with an energy greater than 500 keV.

124 Claims, 20 Drawing Sheets

Related U.S. Application Data continuation of application No. 12/459,478, filed on Jun. 30, 2009, now abandoned.

(60) Provisional application No. 61/133,604, filed on Jun. 30, 2008.

(58) Field of Classification Search
USPC .................. 250/396 R, 397, 492.1, 492.3
See application file for complete search history.

(56) References Cited

U.S. PATENT DOCUMENTS

| | | |
|---|---|---|
| 3,845,305 A | 10/1974 | Liebl |
| 3,900,737 A | 8/1975 | Collier et al. |
| 3,924,113 A | 12/1975 | Gill et al. |
| 4,093,891 A | 6/1978 | Christie et al. |
| 4,124,802 A | 11/1978 | Terasawa et al. |
| 4,132,892 A | 1/1979 | Wittmaack |
| 4,153,843 A | 5/1979 | Pease |
| 4,255,661 A | 3/1981 | Liebl |
| 4,323,638 A | 4/1982 | Adams et al. |
| 4,327,292 A | 4/1982 | Wang et al. |
| 4,383,180 A | 5/1983 | Turner |
| 4,418,283 A | 11/1983 | Trotel |
| 4,430,571 A | 2/1984 | Smith et al. |
| 4,431,923 A | 2/1984 | Wang et al. |
| 4,433,384 A | 2/1984 | Berrian et al. |
| 4,445,039 A | 4/1984 | Yew |
| 4,467,240 A | 8/1984 | Futamoto et al. |
| 4,469,950 A | 9/1984 | Taylor et al. |
| 4,477,729 A | 10/1984 | Chang et al. |
| 4,482,802 A | 11/1984 | Aizawa et al. |
| 4,494,004 A | 1/1985 | Mauer, IV et al. |
| 4,498,010 A | 2/1985 | Biechler et al. |
| 4,511,980 A | 4/1985 | Watanabe et al. |
| 4,525,629 A | 6/1985 | Morita et al. |
| 4,556,794 A | 12/1985 | Ward et al. |
| 4,556,798 A | 12/1985 | McKenna et al. |
| 4,563,587 A | 1/1986 | Ward et al. |
| 4,687,940 A | 8/1987 | Ward et al. |
| 4,698,509 A | 10/1987 | Wells et al. |
| 4,710,632 A | 12/1987 | Ishitani et al. |
| 4,716,127 A | 12/1987 | Shukuri et al. |
| 4,757,208 A | 7/1988 | McKenna et al. |
| 4,774,414 A | 9/1988 | Umemura et al. |
| 4,789,787 A | 10/1988 | Parker |
| 4,804,837 A | 2/1989 | Farley |
| 4,806,921 A | 2/1989 | Goodman et al. |
| 4,816,692 A | 3/1989 | Rudert |
| 4,818,872 A | 4/1989 | Parker |
| 4,818,885 A | 4/1989 | Davis et al. |
| 4,837,447 A | 6/1989 | Pierce et al. |
| 4,853,870 A | 8/1989 | Yasutake et al. |
| 4,874,460 A | 10/1989 | Nakagawa et al. |
| 4,879,605 A | 11/1989 | Warkentin et al. |
| 4,885,472 A | 12/1989 | Young |
| 4,893,163 A | 1/1990 | Rudeck |
| 4,908,226 A | 3/1990 | Kubena et al. |
| 4,929,839 A | 5/1990 | Parker et al. |
| 4,936,968 A | 6/1990 | Ohnishi et al. |
| 4,957,771 A | 9/1990 | Enloe |
| 4,967,380 A | 10/1990 | Szajnowski et al. |
| 5,103,101 A | 4/1992 | Berlund et al. |
| 5,136,171 A | 8/1992 | Leung et al. |
| 5,149,976 A | 9/1992 | Sipma |
| 5,155,368 A | 10/1992 | Edwards et al. |
| 5,187,371 A | 2/1993 | Matsui et al. |
| 5,223,109 A | 6/1993 | Itoh et al. |
| 5,241,182 A | 8/1993 | Martin et al. |
| 5,244,820 A | 9/1993 | Kamata et al. |
| 5,301,124 A | 4/1994 | Langner et al. |
| 5,306,601 A | 4/1994 | Hashimoto et al. |
| 5,329,130 A | 7/1994 | Kai et al. |
| 5,331,172 A | 7/1994 | Kumar et al. |
| 5,393,987 A | 2/1995 | Abboud et al. |
| 5,447,614 A | 10/1995 | Hamamura et al. |
| 5,580,419 A | 12/1996 | Berenz |
| 5,598,002 A | 1/1997 | Todokoro et al. |
| 5,621,216 A | 4/1997 | Clarke et al. |
| 5,654,127 A | 8/1997 | Leedy |
| 5,683,595 A | 11/1997 | Nagamachi |
| 5,725,995 A | 3/1998 | Leedy |
| 5,827,786 A | 10/1998 | Puretz |
| 5,834,786 A | 11/1998 | White et al. |
| 5,844,416 A | 12/1998 | Campbell et al. |
| 5,892,231 A | 4/1999 | Baylor et al. |
| 5,904,552 A | 5/1999 | Shiralagi et al. |
| 6,028,662 A | 2/2000 | Sturans et al. |
| 6,137,112 A | 10/2000 | McIntyre et al. |
| 6,145,438 A | 11/2000 | Berglund et al. |
| 6,242,751 B1 | 6/2001 | Takemoto et al. |
| 6,274,290 B1 | 8/2001 | Veneklasen et al. |
| 6,344,116 B2 | 2/2002 | Warner, Jr. et al. |
| 6,410,924 B1 | 6/2002 | Wang |
| 6,423,976 B1 | 7/2002 | Glavish et al. |
| 6,462,347 B1 | 10/2002 | Oh |
| 6,492,261 B2 | 12/2002 | Gavish et al. |
| 6,573,014 B2 | 6/2003 | Yamaguchi et al. |
| 6,583,426 B1 | 6/2003 | Kawanami et al. |
| 6,605,816 B2 | 8/2003 | Sandstrom |
| 6,635,890 B2 | 10/2003 | Saadatmand et al. |
| 6,753,538 B2 | 6/2004 | Musil et al. |
| 6,759,665 B2 | 7/2004 | Benveniste et al. |
| 6,768,120 B2 | 7/2004 | Leung et al. |
| 6,768,125 B2 | 7/2004 | Platzgummer et al. |
| 6,812,453 B2 | 11/2004 | Bateman |
| 6,818,910 B2 | 11/2004 | Stanton et al. |
| 6,825,101 B1 | 11/2004 | Hawryluk et al. |
| 6,835,289 B2 | 12/2004 | Yamashita |
| 6,888,146 B1 | 5/2005 | Leung et al. |
| 6,924,493 B1 | 8/2005 | Leung |
| 6,996,450 B2 | 2/2006 | Suttile et al. |
| 6,998,217 B2 | 2/2006 | Martyniuk et al. |
| 7,005,044 B2 | 2/2006 | Kramer et al. |
| 7,014,735 B2 | 3/2006 | Kramer et al. |
| 7,053,981 B2 | 5/2006 | Bleeker |
| 7,091,134 B1 | 8/2006 | Meinhold et al. |
| 7,098,614 B2 | 8/2006 | Yamashita |
| 7,129,502 B2 | 10/2006 | Kruit |
| 7,202,488 B2 | 4/2007 | Ota et al. |
| 7,202,691 B2 | 4/2007 | Lagowski et al. |
| 7,242,012 B2 | 7/2007 | Leedy |
| 7,259,373 B2 | 8/2007 | Zani et al. |
| 7,329,882 B2 | 2/2008 | Rathmell et al. |
| 7,368,729 B2 | 5/2008 | Shichi et al. |
| 7,485,244 B2 | 2/2009 | Nakamura et al. |
| 7,488,960 B2 | 2/2009 | Zani et al. |
| 7,495,242 B2 | 2/2009 | Zani et al. |
| 7,495,244 B2 | 2/2009 | Zani et al. |
| 7,495,245 B2 | 2/2009 | Zani et al. |
| 7,501,644 B2 | 3/2009 | Zani et al. |
| 7,507,960 B2 | 3/2009 | Zani et al. |
| 7,659,526 B2 | 2/2010 | Zani et al. |
| 7,755,066 B2 | 7/2010 | Evans |
| 8,658,994 B2 | 2/2014 | Zani et al. |
| 10,991,545 B2 * | 4/2021 | Bennahmias ........... H01J 37/04 |
| 2002/0094694 A1 | 7/2002 | Phillip et al. |
| 2003/0038254 A1 | 2/2003 | Kourosh et al. |
| 2003/0102444 A1 | 6/2003 | Deppert et al. |
| 2003/0168608 A1 | 9/2003 | Ji et al. |
| 2003/0205679 A1 | 11/2003 | Benveniste |
| 2004/0020434 A1 | 2/2004 | Gavish et al. |
| 2004/0046585 A1 | 3/2004 | Kamieniecki et al. |
| 2004/0051053 A1 | 3/2004 | Barletta et al. |
| 2004/0065842 A1 | 4/2004 | Parr et al. |
| 2004/0146133 A1 | 6/2004 | Leung |
| 2004/0150068 A1 | 8/2004 | Leedy |
| 2004/0178170 A1 | 9/2004 | Morimoto |
| 2005/0242299 A1 | 11/2005 | Elmer et al. |
| 2006/0008707 A1 | 1/2006 | Watanabe et al. |
| 2006/0043312 A1 | 3/2006 | Siebert et al. |
| 2006/0046522 A1 | 3/2006 | Ahn et al. |
| 2006/0160431 A1 | 7/2006 | Herbst et al. |
| 2006/0163496 A1 | 7/2006 | Hiramoto et al. |

(56) References Cited

U.S. PATENT DOCUMENTS

| | | | |
|---|---|---|---|
| 2006/0163498 | A1 | 7/2006 | Yoneda et al. |
| 2006/0169924 | A1 | 8/2006 | Purser |
| 2006/0228634 | A1 | 10/2006 | Bret et al. |
| 2007/0045534 | A1 | 3/2007 | Zani |
| 2007/0050446 | A1 | 3/2007 | Moore |
| 2007/0085032 | A1 | 4/2007 | Buller et al. |
| 2008/0061233 | A1 | 3/2008 | Ogawa |
| 2008/0160431 | A1 | 7/2008 | Scott et al. |
| 2008/0191151 | A1 | 8/2008 | Shichi et al. |
| 2009/0280629 | A1 | 11/2009 | Tan et al. |
| 2011/0065237 | A1 | 3/2011 | Bennahmias et al. |
| 2013/0040458 | A1 | 2/2013 | Scott et al. |
| 2013/0181139 | A1 | 7/2013 | Eisner et al. |

OTHER PUBLICATIONS

Aihara, R. et al., "Stabilization of an electrostatic lens for a focused ion beam system," J. Vac. Sci. Technol. B 6 (3), May/Jun. 1988, pp. 958-961.
Arimoto, H. et al., "Energy distributions of liquid metal alloy ion sources," J. Vac. Sci. Technol. B 6 (3), May/Jun. 1988, pp. 919-922.
Bell, A. et al., "A low-current liquid metal ion source," J. Vac. Sci. Technol. B 6 (3), May/Jun. 1988, pp. 927-930.
Brewer, G. et al., Electron-Beam Technology in Microelectronic Fabrication, Academic Press, 1980.
Carlsten, B. "Klystron Beam-Bunching Lecture," 1996 US/CERN/Japan Accelerator School, Conf-9609245-1, Los Alamos National Lab, New Mexico.
Chalupka et al., "Novel electrostatic column for ion projection lithography," J. Vac. Sci. Technol. B 12 (6), Nov./Dec. 1994, pp. 3513-3517.
Chao et al., "Spherical aberration corrector using space charge," J. Vac. Sci. Technol. B 15 (6), Nov./Dec. 1997, pp. 2732-2736.
Chason et al., "Ion beams in silicon processing and characterization," J. Appl. Phys. 81(10), May 15, 1997, pp. 6513-6560.
Chen et al., "Study of H−beams for ion-projection lithography," J. Vac. Sci. Technol. B 13 (6), Nov./Dec. 1995, pp. 2597-2599.
Corelli et al., "Summary Abstract: Liquid metal ion sources and applications in focused ion beams systems," J. Vac. Sci. Technol. B 6 (3), May/Jun. 1988, p. 936.
Current, "Current Status of Ion Implantation and Techniques for Manufacturing Semiconductor IC Fabrication," Nuclear Instruments and Methods in Physics Research B6 (1985), pp. 9-15.
Dahl et al., "A modular ion beam deflector," International Journal of Mass Spectrometry 189 (1999), pp. 47-51.
Dai, "Binary Lossless Layout Compression Algorithms and Architectures for Direct-Write Lithography Systems," Masters of Science, Plan II, UC Berkeley, 2000.
De Marco et al., "Maskless fabrication of JFETs via focused ion beams," Solid-State Electronics 48 (2004), pp. 1833-1836.
Della Ratta et al., "Focused-ion beam induced deposition of copper," J. Vac. Sci. Technol. B (11)6, Nov./Dec. 1993, pp. 2195-2199.
Dennen et al., "50 KeV e-beam resist characterization for the 100nm lithography node and below," available at www.spie.org/Conferences/programs/01/pm/Conferences.html, 2001.
Edinger et al., "Modeling of focused ion beam induced surface chemistry," J. Vac. Sci. Technol. B 18 (6), Nov./Dec. 2000, pp. 3190-3193.
Edinger et al., "Study of precursor gases for focused ion beam insulator deposition," J. Vac. Sci. Technol. B 16 (6), Nov./Dec. 1998, pp. 3311-3314.
Freyer et al, "Design of an Accurate Production E-Beam System," Solid State Technology, Sep. 1983, pp. 165-170.
Freyer et al., "Enhanced Pattern Accuracy with MEBES III," SPIE vol. 471 Electron-Beam, X-Ray, and Ion-Beam Techniques for Submicrometer Lithogrphies III (1984), pp. 8-17.
Gamo, "Recent advances of focused ion beam technology," Nuclear Instruments and Methods in Physics Research B 121 (1997), pp. 464-469.
Geraci et al., "High-order maps with acceleration for optimization of electrostatic and radio-frequency ion-optical elements," Review of Scientific Instruments, vol. 73, No. 9, Sep. 2002, pp. 3174-3180.
Gierlings et al., "MONA Merging Optics and Nanotechnologies," Frame of Reference Final Report of Work Package 1, www.ist-mona.org, Nov. 30, 2005, pp. 1-273.
Herlihey, "Micro-Fabrication on Macroscopic Areas Via Maskless and Resistless Focused Ion Beam Lithography," University of Virginia, MS Dissertation, 2005, pp. 1-188.
Humphries, Charged Particle Beams, John Wiley and Sons (ISBN 0-471-60014-8, QC786.H86) 1990, Chapter 15, pp. 720-812.
Ishitani et al., "Favorable source material in liquid-metal-ion sources for focused beam applications," J. Vac. Sci. Technol. B 6 (3), May/Jun. 1988, pp. 931-935.
Ji, "Maskless, Resistless Ion Beam Lithography Processes," A dissertation for Doctor of Philosophy in EECS, UC Berkeley, Spring 2003, pp. 1-128.
Junphong et al., "The System of Nanosecond 280-keV-He+ Pulsed Beam," Particle Accelerator Conference (PAC 05), May 16-20, 2005, Knoxville, Tennessee, SLAC-PUB-11847.
Koh, "Characteristics of W films formed by ion beam assisted deposition," J. Vac. Sci. Technol. B 9 (5), Sep./Oct. 1991, pp. 2648-2652.
Komano et al., "Silicon Oxide Film Formation by Focused Ion Beam (FIB)-Assisted Deposition," JJAP vol. 28, No. 11, Nov. 1989, pp. 2372-2375.
Kompfner, "Travelling-Wave Tubes," Rep. Prog. Phys., 1952, pp. 275-327.
Komuro et al., "Focused Ga ion beam etching characteristics of GaAs with Cl2," J. Vac. Sci. Technol. B 9 (5), Sep./Oct. 1991, pp. 2656-2659.
Komuro et al., "On the mechanism of energy distribution in liquid metal ion sources," J. Vac. Sci. Technol. B 6 (3), May/Jun. 1988, pp. 923-926.
Kubena et al., "A low magnification focused ion beam system with 8 nm spot size", J. Vac. Sci. Technol. B 9 (6), Nov./Dec. 1991, pp. 3079-3083.
Kubena et al., "Selective area nucleation for metal chemical vapor deposition using focused ion beams," J. Vac. Sci. Technol. B 6 (6), Nov./Dec. 1988, pp. 1865-1868.
Li et al., "An Eulerian method for computing multi-valued solutions of the Euler-Poisson equations and applications to wave breaking in klystrons," Submitted to Phys. Rev. E, Mar. 2003, pp. 1-14.
Liu et al., "High-speed focused-ion-beam patterning for guiding the growth of anodic alumina nanochannel arrays," Applied Physics Letters, vol. 82, No. 8, Feb. 2003, pp. 1281-1283.
Liu, "Rapid Nano-Patterning of Polymeric Thin Films With Ga+ Focused Ion Beam," Ph.D. Dissertation, University of Virginia, Jan. 2005.
Lugstein et al., "Focused Ion Beam Technology—A New Approach for the Sub 100nm Microfabrication Regime," Proc. "Current Developments of Microelectronics," Bad Hofgastein, Mar. 1999, pp. 175-180.
Madokoro et al., "Focused Phosphorus Ion Beam Implantation Into Silicon," Nuclear Instruments and Methods in Physics Research B39 (1989), pp. 511-514.
Matsui et al., "High-Resolution focused ion beam lithography," J. Vac. Sci. Technol. B 9 (5), Sep./Oct. 1991, pp. 2622-2632.
McCord et al., Handbook of Microlithography, Micromachining, and Microfabrication, vol. 1, ISBN 0-8194-2378-5, 1997.
Melngailis et al., "A review of ion projection lithography," J. Vac. Sci. Technol. B 16 (3), May/Jun. 1998, pp. 927-957.
Melngailis et al., "Focused Ion Beam Fabrication of Microelectronic Structures," Final Report, U.S. Army Research Office, Contract #DAAL 03-90-G0223, Dec. 30, 1993.
Melngailis, "Ion Sources for Nanofabrication and High Resolution Lithography," Proceedings of the 2001 Particle Accelerator Conference, Chicago SSN 0-7803-7191-7/01 IEEE, pp. 76-80.
Mitan et al., "Direct patterning of nanometer-scale silicide structures on silicon by ion-beam implantation through a thin barrier layer," Applied Physics Letters vol. 78, No. 18, Apr. 30, 2001, pp. 2727-2729.

(56) References Cited

OTHER PUBLICATIONS

Morimoto et al., "Focused ion beam lithography and its application to submicron devices," Microelectronic Engineering 4 (1986), pp. 163-179.
Nagamachi et al., "Focused ion beam direct deposition and its applications," J. Vac. Sci. Technol. B 16 (4), Jul./Aug. 1998, pp. 2515-2521.
Namba, "Focused Ion Beam Processing," Nuclear Instruments and Methods in Physics Research B39 (1989), pp. 504-510.
Narum et al., "A variable energy focused ion beam system for in situ microfabrication," J. Vac. Sci. Technol. B 6 (3), May/Jun. 1988, pp. 966-973.
Paik et al., "Analytical calculation of electronstatic beam blanker performance," J. Phys. E: Sci. Instrum. 20 (1987), pp. 61-66.
Paik et al., "Systematic design of an electrostatic optical system for ion beam lithography," J. Vac. Sci. Technol. B 3 (1), Jan./Feb. 1985, pp. 75-81.
Pease, "Scanning Electron Beam Lithography and Other Microlithography Techniques," Microscience, Scanning Electron Beam Lithography, pp. 245-276.
Petroff et al., "Nanostructures processing by focused in beam implantation," J. Vac. Sci. Technol. B 9 (6), Nov./Dec. 1991, pp. 3074-3078.
Rau et al., "Shot-noise and edge roughness effects in resists patterned at 10 nm exposure," J. Vac. Sci. Technol. B 16 (6), Nov./Dec. 1998, pp. 3784-3788.
Rauscher, "Development of an Advanced Low Energy Focused Ion Beam System Based on Immersion Optics," Dissertation, Eberhard-Karls-Universitat zu Tubingen, Jul. 31, 2006.
Ro et al., "Mechanism of ion beam induced deposition of gold," J. Vac. Sci. Technol. B 12 (1), Jan./Feb. 1994, pp. 73-77.
Sakaguchi et al., "Focused ion beam optical column design and consideration on minimum attainable beam size," J. Vac. Sci. Technol. B 16 (4), Jul./Aug. 1998, pp. 2462-2468.
Santamore et al., "Focused ion beam sputter yield change as a function of scan speed," J. Vac. Sci. Technol., B 15 (6), Nov./Dec. 1997, pp. 2346-2349.
Sato et al., "A method for calculating the current density of charged particle beams and the effect of finite source size and spherical and chromatic aberrations on the focusing characteristics," J. Vac. Sci. Technol. B 9 (5), Sep./Oct. 1991, pp. 2602-2608.
Sawaragi et al., "Development of a focused ion beam system: Current status and future prospects," J. Vac. Sci. Technol. B 6 (3), May/Jun. 1988, pp. 962-965.
Schachter, "Advanced Acceleration Concepts," Technion—Israel Institute of Technology, Presented at CERN, Oct. 2002.
Schwank et al., "BUSFET—A Novel Radiation-Hardened SOI Transistor," IEEE Transactions on Nuclear Science, vol. 46, No. 6 (1999), SAND99-0323J.
Shinada et al., "Improvement of Focused Ion-Beam Optics in Single-Ion Implantation for Higher Aiming Precision of One-by-One Doping of Impurity Atoms into Nano-Scale Semiconductor Devices," JJAP vol. 41, Part 2, No. 3A, Mar. 1, 2002, pp. L287-L290.
Shiokawa et al., "40 nm Width Structure of GaAs Fabricated by Fine Focused Ion Beam Lithography and Chlorine Reactive Ion Etching," JJAP vol. 27, No. 6, Jun. 1988, pp. L1160-L1161.
Sills et al., "E-Beam System Metrology," Solid State Technology, Sep. 1983, pp. 191-196.
Smirnov et al., "An Operative Measurement of RF Parameters for Slow-Wave Systems," Russian Research Center "Kurchatov Institute," EPAC 1994/1995, pp. 1995-1997.
Stanishevsky, "Patterning of diamond and amorphous carbon films using focused ion beams," Thin Solid Films 398-399 (2001), pp. 560-565.
Stenning et al., "The Pathfinder Program and Its Application to Ion Optics," Department of Physical Science, University of Reading Berkshire, May 1968, pp. 1-60.
Sugimoto et al., "In situ overgrowth on GaAs patterned by focused-ion-beam-assisted Cl2 etching," J. Vac. Sci. Technol. B 9 (5), Sep./Oct. 1991, pp. 2703-2707.
Szilagyi et al., "Optimum design of electrostatic lenses," J. Vac. Sci. Technol. B 6 (3), May/Jun. 1988, pp. 953-961.
Szilagyi, "Synthesis of electron and ion optical columns," J. Vac. Sci. Technol. B 9 (5), Sep./Oct. 1991, pp. 2617-2621.
Szilagyi, Electron Beam and Electron Optics, Chapter 4, Plenum, New York, 1988, pp. 4-1-4-31.
Tian et al., "On Mask Layout Partitioning for Electron Projection Lithography," 0-7803-7607, Feb. 2, 2002, IEEE.
Tobias et al., "Electron-beam lithography three-mark silicon automatic registration capabilities for process distortion compensation," J. Vac. Sci. Technol. 21 (4), Nov./Dec. 1982, pp. 999-1004.
Tsumagari et al., "Design of a low-aberration lens for focused ion beams," J. Vac. Sci. Technol. B 6 (3), May/Jun. 1988, pp. 949-952.
Turnbull, "Direct spherical and chromatic aberration correction for charged particle optical systems," J. Vac. Sci. Technol. B 22 (6), Nov./Dec. 2004, pp. 3560-3564.
Wadlinger, "Beam-Bunching with a Linear-Ramp Including Space-Charge Force Effects Cylinder Model," Accelerator Operations and Technology Division, Los Alamos National Laboratory, 1996.
Wang, "Design optimization for two lens focused ion beam columns," J. Vac. Sci. Technol. B 15 (4), Jul./Aug. 1997, pp. 833-839.
Watanabe et al., "RF Beam Buncher for the HiECR Ion Source," University of Tokyo, p. 72, CNS Annual Report 2003.
Watt et al., "Ion Beam Lithography and Nanofabrication: A Review," International Journal of Nanoscience, vol. 4, No. 3, (2005), pp. 269-286.
Weiner et al., "Fabrication of sub-40-nm p-n junctions for 0.18 mm MOS device applications using a cluster-tool-compatible, nanosecond thermal doping technique," SPIE vol. 2091, 0-8194-1362-5/94, pp. 63-70.
Yang et al., "Gray-Scale Electron-Beam Lithography," 2005 NNIN REU Research Accomplishments, pp. 160-161.
Yoon et al., "Duty Cycle and Modulation Efficiency to Two-Channel Hadamard Transform Time-of-Flight Mass Spectrometry," 2005 Amercian Society for Mass Spectrometery, 1044-0305/05, pp. 1888-1901.
Zani et al., "Focused ion beam high Tc superconductor de SQUIDs," Appl. Phys. Lett. 59 (2), Jul. 8, 1991, pp. 234-236.
Zavecz et al., "A Comprehensive Test Sequence for the Electron Beam Exposure System," Solid State Technology, Feb. 1982, pp. 106-110.

\* cited by examiner

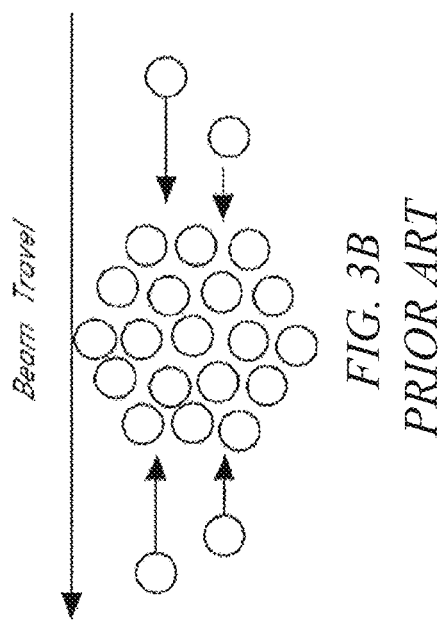

Straight Wall　　Taper　　Bow Tie

METHOD AND DEVICE FOR SPATIAL CHARGED PARTICLE BUNCHING

CROSS-REFERENCE TO RELATED APPLICATIONS

This application is a continuation of U.S. application Ser. No. 16/532,368, filed Aug. 5, 2019, which is a continuation of U.S. application Ser. No. 12/459,478, filed Jun. 30, 2009, which claims priority under 35 U.S.C. § 119(e) to U.S. Provisional Application Ser. No. 61/133,604, filed Jun. 30, 2008, entitled "METHOD AND DEVICE FOR SPATIAL CHARGED PARTICLE BUNCHING," which is incorporated herein by reference in its entirety.

BACKGROUND OF THE INVENTION

Field of the Invention

The present application relates to charged particle beams. More specifically, the present application relates to methods and apparatuses for spatial charged particle bunching.

Description of the Related Art

Photolithography has been a key patterning step in most integrated circuit fabrication processes. Resist, a photosensitive plastic, is spun on a workpiece, baked, and exposed in a pattern through a reticle, usually by ultraviolet (UV) light. After development and a second bake, the surface is left partially covered by an inert organic film that resists various treatments to which the workpiece is subjected. Such treatments include material removal by wet chemical etch or by gaseous plasma etch, doping by ion implantation (e.g., broad beam implantation), and addition of material (e.g., lift-off). The preparation, exposure, development; clean, care, and stripping of resist can increase the number of fabrication steps tenfold, requiring expensive equipment and facilities to establish stable, qualified, and high yield fabrication.

Photolithography has been the main lithographic tool for processing patterns of resist down to 45 nanometers (run). However, present and future microelectronics will require minimum feature sizes below 45 nm. While advances in a number of lithography techniques (e.g., ultraviolet (UV), enhanced ultraviolet (EUV) emersion, maskless emersion, laser, phase-shift, projection ion, and electron beam lithography (EBL)) may enable highscale production at these dimensions, they are all nearing their theoretical limits with respect to wavelength, overlay accuracy, and/or cost. Pushed to the limit, the weaknesses of each process present difficult problems, and the resulting patterning defects can result in significant yield loss.

SUMMARY OF THE INVENTION

In certain embodiments, a charged particle buncher includes a series of spaced apart electrodes arranged to generate a shaped electric field. The series includes a first electrode, a last electrode and one or more intermediate electrodes. The charged particle buncher includes a waveform device attached to the electrodes and configured to apply a periodic potential waveform to each electrode independently in a manner so as to form a quasi-electrostatic time varying potential gradient between adjacent electrodes and to cause spatial distribution of charged particles that form a plurality of nodes and antinodes. The nodes have a charged particle density and the antinodes have substantially no charged particle density, and the nodes and the antinodes are formed from a charged particle beam with an energy greater than 500 keV.

In certain embodiments, a charged particle buncher includes a series of spaced apart electrodes arranged to generate a shaped electric field. The series includes a first electrode, a last electrode and one or more intermediate electrodes. The charged particle buncher includes a buncher control device configured to generate the shaped electric field which causes spatial alignment of charged particles such that the mass of charged particles is filtered by positional displacement forming a plurality of nodes and anti nodes along the axis I of propagation. The nodes have a charged particle density and the antinodes have substantially no charged particle density, and the nodes and the antinodes are formed from a charged particle beam with an energy greater than 500 keV.

In certain embodiments, a charged particle funnel includes a series of spaced apart electrodes arranged to generate a radial shaped electric field. The series includes a first electrode, a last electrode and one or more intermediate electrodes. The charged particle funnel includes a buncher control device configured to generate the radial shaped electric field which causes the position of charged particles to be displaced radially to the direction of propagation while creating an axial time varying electric field that causes a steady or segmented uniform spatial distribution of charged particles that form a plurality of nodes and antinodes. The nodes have a charged particle density and the antinodes have substantially no charged particle density, and the nodes and the antinodes are formed from a charged particle beam with an energy greater than 500 keV.

BRIEF DESCRIPTION OF THE DRAWINGS

These and other features, aspects, and advantages of the invention disclosed herein are described below with reference to the drawings of preferred embodiments, which are intended to illustrate and not to limit the invention.

FIG. 3B schematically illustrates bunching of charged particles;

DETAILED DESCRIPTION OF THE PREFERRED EMBODIMENT

Figure 1B:
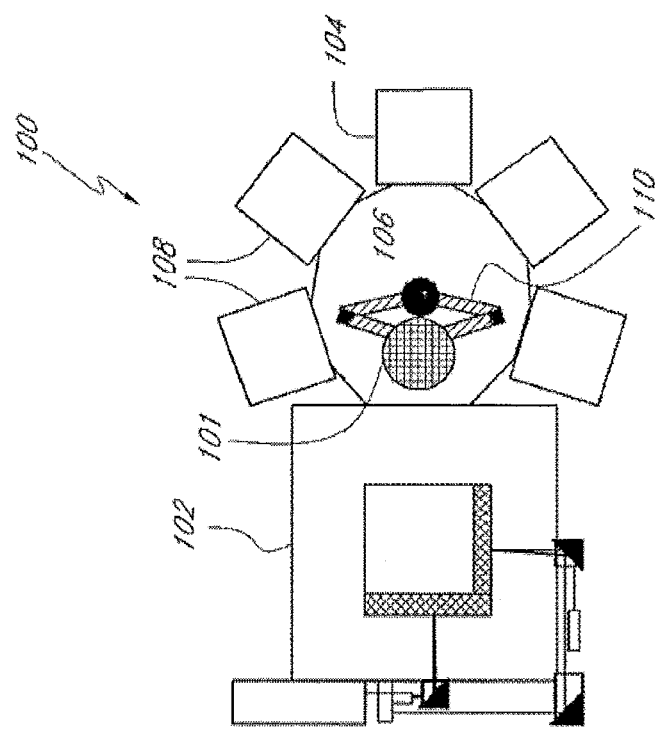
FIG. 1B is a top schematic view of the apparatus of FIG. 1A.

Although certain preferred embodiments and examples are disclosed below, it will be understood by those in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

Embodiments of charged particle beam bunchers are described herein. Optional prior art environments of use for embodiments of methods for operating charged particle beam bunchers are also described below and in U.S. Pat. No. 7,259,373, Which is incorporated herein by reference in its entirety.

Smaller device geometries may be achieved by direct writing with a beam of charged particles. Focused ion beam (FIB) systems generally do not have sufficient ion exposure to support high throughput manufacturing. Furthermore, only relatively low speed deflection is available using existing ion optics/deflection electronics methodologies, preventing efficient direct write of layers patterned for semiconductor devices. As such, FIB has been limited to mask (e.g., reticle) and semiconductor repair. As FIB technology progressed, it supported the ability to simultaneously deposit, etch, and implant patterns directly on workpieces without the use of resist. Problems remained, however, including low energy systems with little-to-no wafer writing software, no metrology systems, and minimal beam current densities and deflection speeds necessary to support the lithography on a high manufacturing scale. Modifications and improvements to FIB systems in accordance with embodiments described herein can achieve suitable manufacturing throughput in both resist processing and resistless fabrication of semiconductor workpieces and other media (e.g., photomask, compact disk (CD), digital video disk (DVD), high definition DVD (HD DVD), Blue Ray, etc.).

The physical properties of a beam of charged particles traveling along an axis with a distribution transverse to the axis can be modified to provide a high speed, digital (or "pulsed") distributed writing beam. Various methods can be used to create a wave of temporally and spatially defined high-density charged particle nodes and low density (or no density) anti-nodes, traveling in a longitudinal path of accelerated particles (herein referred to as a "digitized beam"). For example, a beam buncher can be used to create localized groups (or "flashes" or "packets") of the charged particles. These groups of charged particles may contain one or more charged particles. The digital beam is then passed through a deflector, whereupon variations in voltage cause the groups of charged particles to change position relative to the direction of propagation. Changes in voltage can be timed in phase with the particle nodes, thereby yielding efficient deflection. The presence of a sharp edge of the antinode effectively provides. fast beam blanking for direct write. Applying the digitized beam to the surface of a workpiece allows resistless patterned processing, including deposition, etching, and/or implantation of material to the surface of the workpiece and/or high resolution resist exposure.

Figure 1A:
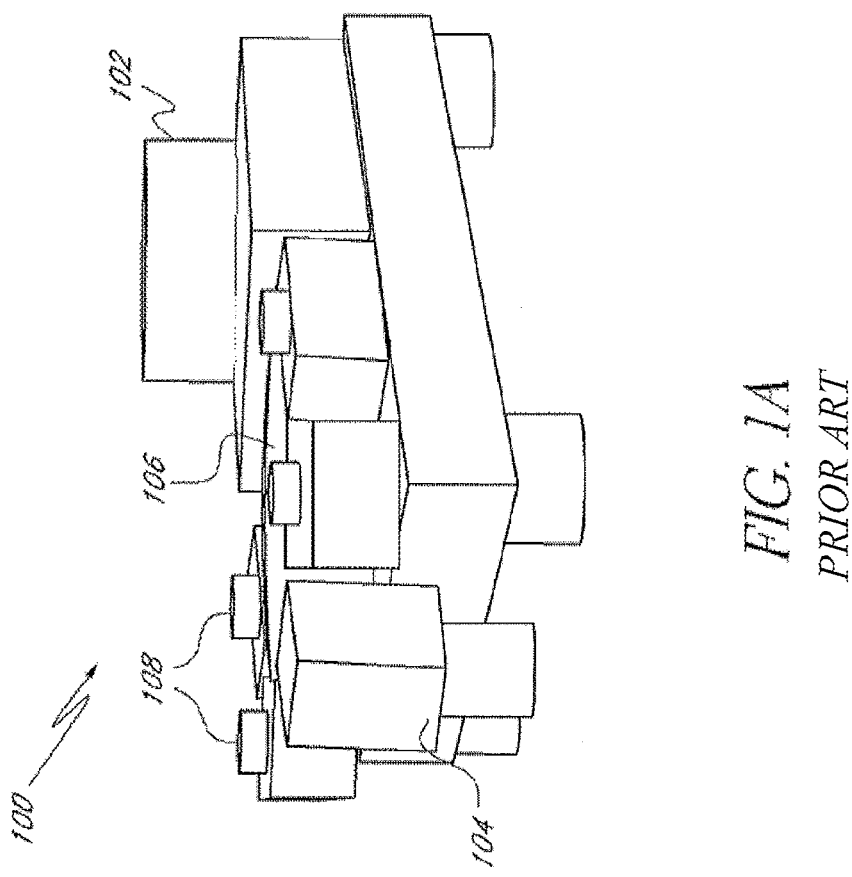
FIG. 1A is a perspective view of a prior art apparatus for controlled particle beam manufacturing.

FIG. 1A is a perspective view of an example apparatus 100. FIG. 1B is a top schematic view of the apparatus 100 of FIG. 1A. The apparatus 100 comprises an exposure chamber 102, a load Jock chamber I 04, a transport module I 06, and a plurality of processing chambers I 08. Although not illustrated, it will be understood that the apparatus 100 comprises a gas manifold system and an automated process controller, described in more detail below.

The load lock chamber 104 may house workpieces 101 that are not being processed, for example, before and/or after processing in the apparatus 100. In certain embodiments, the load lock chamber 104 is configured to achieve vacuum such that an automated material handling system (AMHS) 110 of the transport module 106 in communication with the load lock chamber 104 may insert and/or remove workpieces 101 without having to be pumped down to or up from vacuum between each transfer. In certain embodiments, the load lock chamber 104 is configured to accept a front opening unified pod (FOUP).

The transport module 106 is configured to move workpieces 101 within the apparatus 100. The transport module 106 comprises an AMHS 110 configured to manipulate at least one workpiece 101. A suitable AMHS 110 can be chosen based on the design of the exposure chamber 102, the load lock chamber 104, the transport module 106, and/or the process chambers 108. In certain embodiments, the AMHS 110 comprises a plurality of transport arms such that workpieces 101 may be manipulated simultaneously (or in parallel).

The transport module 106 can include a workpiece prealigner, such that the workpieces 101 removed by the transport arm 110 and subsequently placed into the exposure chamber 102 or a process chamber 108 are in an orientation that is ready for processing in the exposure chamber 102 or a process chamber 108. For example, the prealigner may use charge-coupled device (CCD) or other imaging devices to locate a flat, notch, or other identifying feature of the workpiece 101. The prealigner can be configured to determine overlay parameters of alignment features on the workpiece 101. The overlay parameters may comprise x and y offset, rotation, etc.

Depending on the type and size of the workpiece 101, a variety of vacuum and handling systems can be used in the apparatus 100. A system capable of processing a variety of workpieces preferably uses a high speed workpiece. handling system. Workpiece into vacuum throughput can be increased by aligning the workpiece under vacuum on the workpiece stage instead of outside the vacuum system. A standard workpiece holder (e.g., a wafer magazine) can be pumped to high vacuum within a few minutes. Alignment of the workpiece 101 under vacuum may increase wafer into vacuum throughput.

The transport module 106 can comprise one or more processing substations, for example comprise one or more buffer zones to hold workpieces 101 between processing steps, a particle contamination detector, a temperature quenching station, and/or a metrology station. The metrology station may be selected from any tool appropriate for that type of workpiece, including, but not limited to, an energy dispersive analyzer (EDS), a wavelength dispersive analyze (WDS), a secondary ion mass spectrometer (SIMS), a scanning electron microscope (SEM), a two-dimensional laser scanning imager, a three-dimensional imaging laser radar (LADAR), a thermal imager, a millimeter wave imager, a workpiece imager, and a camera.

Figure 2:
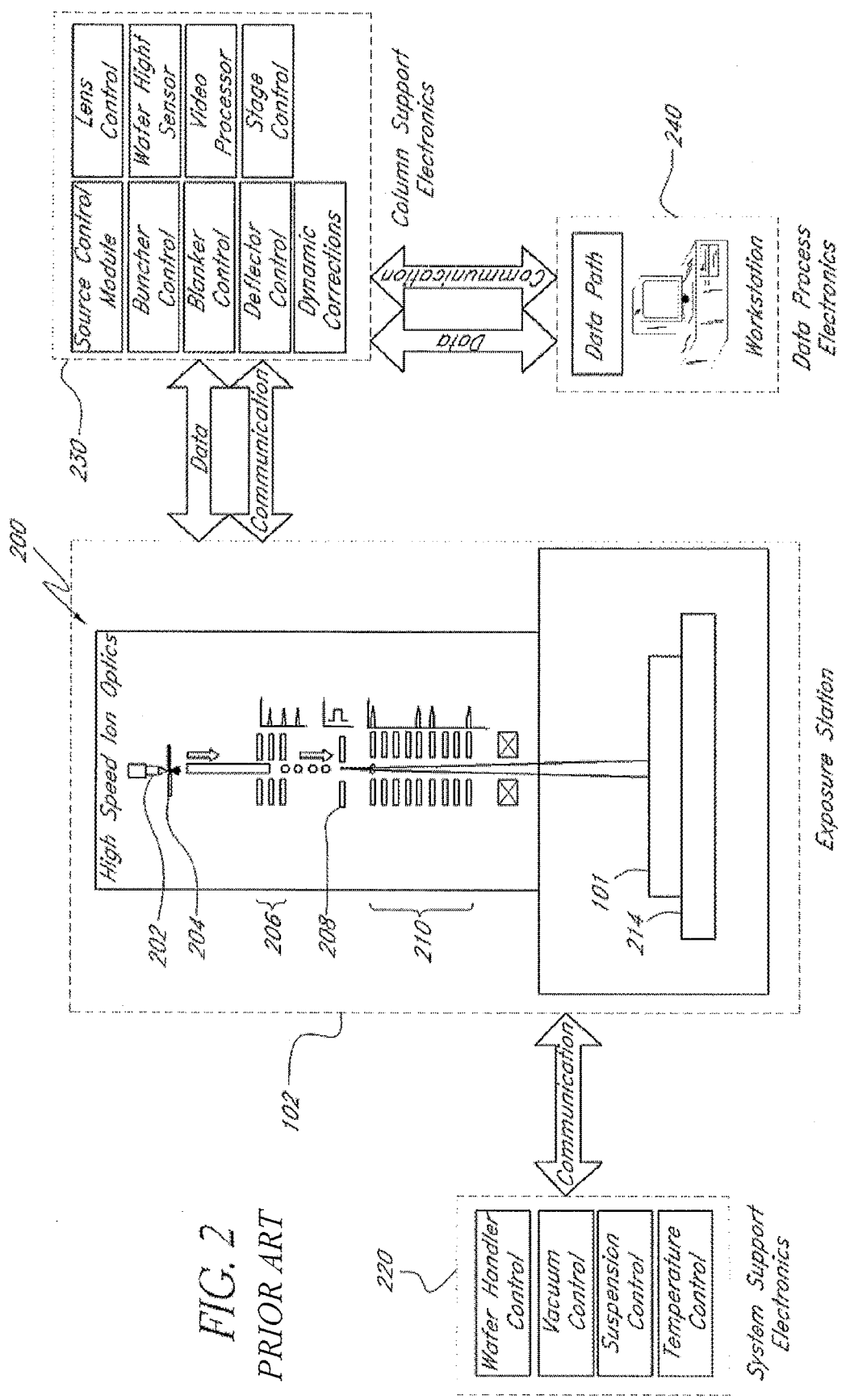
FIG. 2 is a schematic block diagram of a prior art charged particle exposure chamber.
Figure 3A:
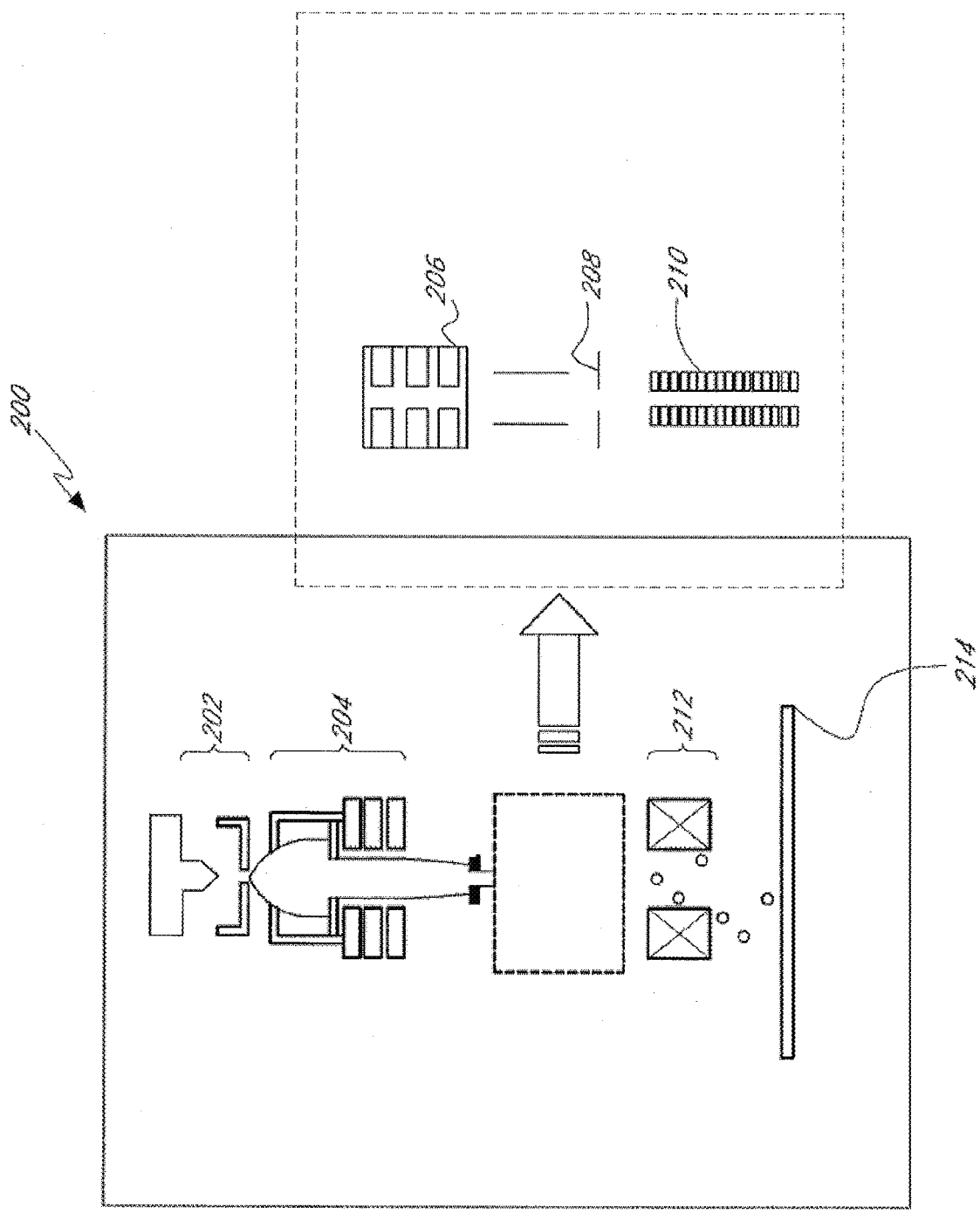
FIG. 3A is a schematic block view of a prior art charged particle column.

The exposure chamber 102 is configured to expose a workpiece 101 to a digital beam of charged particles. As shown. in FIG. 2, the exposure chamber 102 comprises a beam column 200, illustrated in more detail in FIG. 3A. The beam column 200 comprises a charged particle source 202 for generating a stream of charged particles. Although systems and methods are described in certain embodiments herein with reference to ions, it will be understood that some systems and methods may utilize charged particles comprising electrons and positrons. Charged particles may include one or more species of positively and negatively charged ions, as well as singly, doubly, triply, etc. charged ions. In some embodiments, the charged particle source 202 is adapted to generate a plurality of ion species. In some embodiments, the charged particle source 202 is adapted to provide a current of 1,000 amperes/cm$^2$ (A/cm$^2$) focused to a 10 nm spot as measured at the target.

Liquid metal ion source (LMIS) technology enables the formation of high current density charged particle beams. An example technique to create a LMIS is a heated reservoir of liquid metal from which a needle protrudes downward. The metal flows down the needle by capillary action. An electric field from an extraction electrode pulls the liquid at the tip of the needle into a sharp cusp (a "Taylor Cone") from which ions are emitted. The point source is very bright (e.g., about 10$^9$ A/teradian/cm$^2$), and, with suitable optics, permits the beam diameter to be as small as 2 nm. A variety of alloys provides several ion species common for semiconductor fabrication.

Accelerating and focusing a distributed energy of ions can introduce chromatic aberrations resulting in a loss of current density efficiency of the ion optic system. The ion beam energy distribution can be measured as the beam full-width-half-max (FWHM) and can be distributed as much as 12%. Improving the current density efficiency and resolving long and short term stability issues can make LMJS performance 'adequate for a semiconductor processing tool. One aspect of various embodiments of the present invention is the realization that beams of charged particles are composed of a distribution of high and low energy trails, which can be advantageously grouped.

At least two mechanisms can contribute to the broadening of the energy distributions: first, effects related to the formation of the ions; and second, space charge forces after ion formation. Ion emissions from a LMIS source are formed either by direct field desorption of an ion at the emitter tip or by field ionization of desorbed atoms at some distance from the emitter tip. Ions generated close to the tip surface can exchange charge with neutral atoms further downstream, forcing a zero energy ion at that point. Since the electric field in the emitter area is high (e.g., between about 20 and 50 Volts/nm), ions formed at different distances from the emitter can have different energies. Space charge effects broaden the energy distribution of the beam, particularly at low velocities. Therefore, the column 200 preferably is configured to accelerate the ions to full energy' directly after formation. The use of low-mass species may aid in ion acceleration when the use of such species is appropriate.

Space charge effects are also aggravated by higher currents. For the LMIS source, the width of the energy distribution is preferably proportional to the current to the ⅔ power. As such, practical application of traditional LMIS sources to lithography show behavior similar to electron beams:

A limitation on the maximum current density achievable with LMIS-based systems results from the energy distribution of the ion beam that is caused by the achromatic aberration in the upper ion optical system. However, the use of a beam digitizer 206 downstream of the charged particle source 202 that is configured to adjust the longitudinal spacing between charged particles so as to create temporally and spatially resolved groups of the charged particles along the axis of propagation can effectively slow faster moving particles and can speed slower moving particles to obtain a uniform velocity, and thus a uniform energy distribution (accelerating voltage) within each group of the digital beam, thereby reducing the effect of the charged particle source chromatic aberration, as illustrated in FIG. 3B.

Figure 8:
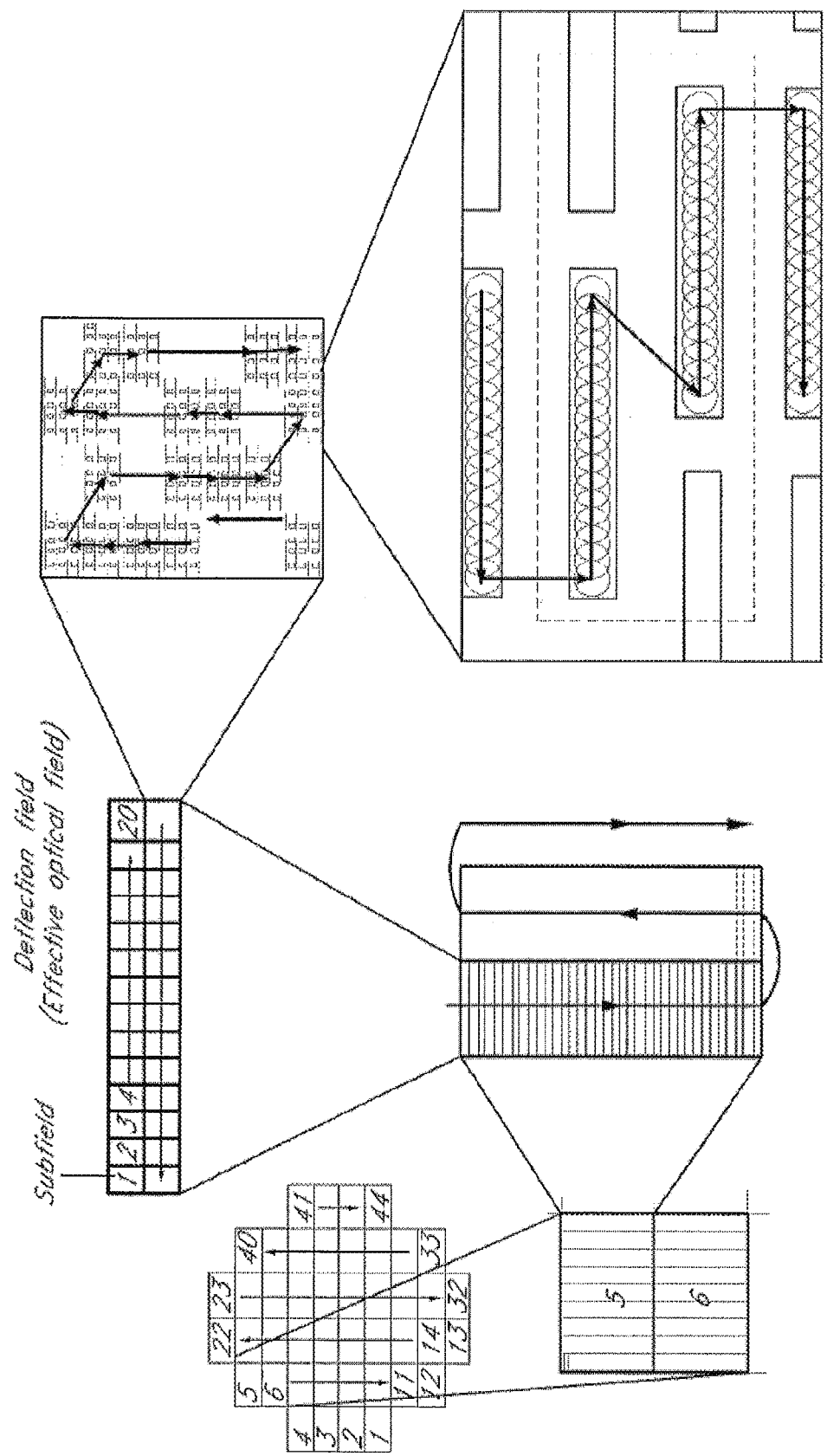
FIG. 8 illustrates an example writing strategy.

Similar to the drift of an electron beam, a LMIS Taylor cone emission unpredictably drifts in' a figure-8 pattern over about a one hour period. Undetected, this drift can cause pattern placement errors. Source lifetime and current stability are barriers to the practical application for production throughput processing tools using traditional LMIS sources. Further improvements at the charged particle source 202 can improve the stability and lifetime, thereby reducing frequent source replacement. The broadening of the energy distribution associated with ion formation can be reduced or minimized by operating the LMIS at low temperature, thereby decreasing the neutral atom density in the proximity of the tip. The energy distribution can also be reduced or minimized by choosing a low vapor pressure species, for example by selecting a doubly ionized species that has a low charge exchange cross-section and that is formed at the surface of the tip, known to have a narrow energy distribution, and by using a species that has the additional benefit of a small virtual source. It will be appreciated that other techniques can also be used.

Extended lifetime of the charged particle source 202 may be achieved by conditioning the source driving parameters prior to operation. As such, the incorporation of an automated conditioning routine can contribute to the extended life and stability of the charged particle source 202. Additionally, a continuous flow strategy, such as impregnated electrode-type needles with hardened tips, can further extend the life span of the charged particle source 202. Second order effects of improved life span can include emission current and position stability improvement. Source emission position stability can be successfully corrected by using an error feedback from occasional beam registrations and adjustment to source servomotors. Although increased ion beam current density is preferred, the column 200 in the exposure chamber 102 need not increase the beam current density.

Other charged particle sources 202 may also be used with the embodiments disclosed herein. For example and without limitation, the charged particle source 202 may comprise a plasma ion source (PIS), a volume plasma ion source (VPJS), a gas field ionization source (GFIS), a carbon nanotube field emitter, a free electron laser and a target, a pulsed laser ablation ion source, a magnetically confined plasma anode source (MAP), and a thermal field emission (TFE) electron source.

The stream of charged particles. emanating from the charged particle source 202 is collimated and directed along a axis by a collimator 204. A variety of collimators 204 comprising a combination of optical elements are appropriate for use in the column 200. For example, and without limitation, the collimator 204 may comprise two or more lenses or a lens and a reflective optic. The collimator 204 may further comprise an aperture configured to shape the charged particle beam. The collimator can be adapted to direct the charged particle stream at accelerating potentials between about 5 and 30 kilo electron volts (keV). The exposure chamber 102 can be adapted to direct the charged particle stream at accelerating potentials between about 5 and 500 keV. A voltage of the collimator 204 can be additive to additional voltages, for example applied by a lower column exit aperture.

If the charged particle source 202 is adapted to generate a plurality of ion species, individual ion species can be selected for specific processing applications by filtering the charged particle stream with a particle filter (e.g., a spectrometer filter). For example, a mass separator can be configured to deflect selected ion species into a mass separator aperture plate. The mass separator is preferably disposed between the collimator 204 and the beam digitizer 206. The mass separator can comprise a reflective optic, an ExB lens, and/or a Wein filter.

The beam digitizer 206 is configured to create a digital beam comprising discrete groups of at least one charged particle by adjusting the longitudinal spacing between charged particles along the axis of propagation. For example, the beam digitizer 206 can be configured to create groups. comprising between about 1 and 7,000,000 charged particles, between about 1 and 100,000 charged particles, between about 1 and 10,000 charged particles, or between about 1 and 50,000 charged particles. The beam digitizer 206 can be configured to create longitudinal spacing D between groups of charged particles of less than about 10 m of beam travel, less than about 1 m of beam travel, less. than about 10 cm of beam. travel, less than about I 0 mm of beam travel, less than about 1 mm of beam travel, less than about 500 m of beam travel, less than about 300 m of beam travel, less than about 100 m of beam travel, less than about 10 m of beam travel, less than about 100 nm of beam travel, less than about. 10 nm of beam travel, or less than about 1 nm of beam travel between the groups of charged particles. The beam digitizer 206 can also be configured to create longitudinal spacing between the groups of charged particles of between about 1 nm and 10 m of beam travel, between about I run and 1 m of beam travel, between about 1 nm and 10 cm of beam travel, between about 1 nm and 10 mm of beam travel, between about 1 nm and 1 mm of beam travel, between about I nm and 500 m of beam travel, between about I nm and 300 m of beam travel, between about 1 run and 100 m of beam travel, between about 1 nm and 10 m of beam travel, between about 1 nm and 100 nm of beam travel or between about 1 nm and 10 nm of beam travel. The longitudinal spacing between the groups of charged particles may be substantially equal, unequal, periodic, harmonic, etc.

The beam digitizer 206 can comprise a beam buncher. In a radio frequency (RF) beam buncher, a stream of charged particles pass through a buncher gap where they are acted upon by an alternating potential, RF or multiple modulating potential wave forms, beat wave, harmonic, variable, or a combination thereof. Velocity modulation compresses the charged particles together so that they form spatially and temporally resolved discrete groups of charged particles. The frequency and the buncher gap length can be configured to match a mean velocity of the groups of charged particles. The applied potential modulates the longitudinal velocity of each charged particle as they pass through the buncher gap so that some charged particles (e.g., charged particles with a lower velocity than the mean velocity) are accelerated while other charged particles (e.g., charged particles with a higher velocity than the mean velocity) are decelerated (e.g., as depicted in FIG. 3B). The gap length of the buncher gap, the magnitude and frequency of the applied potential, and the time of flight (TOF) of the charged particles through the column 200 determine the final characteristics of the digital beam and the groups of charged particles at the surface of the workpiece 101.

Figure 3C:
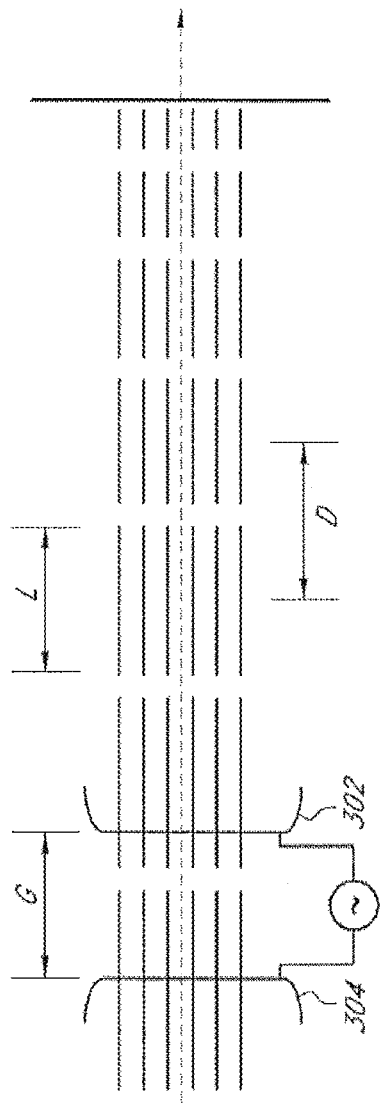
FIG. 3C schematically illustrates a prior art beam buncher.
Figure 3D:
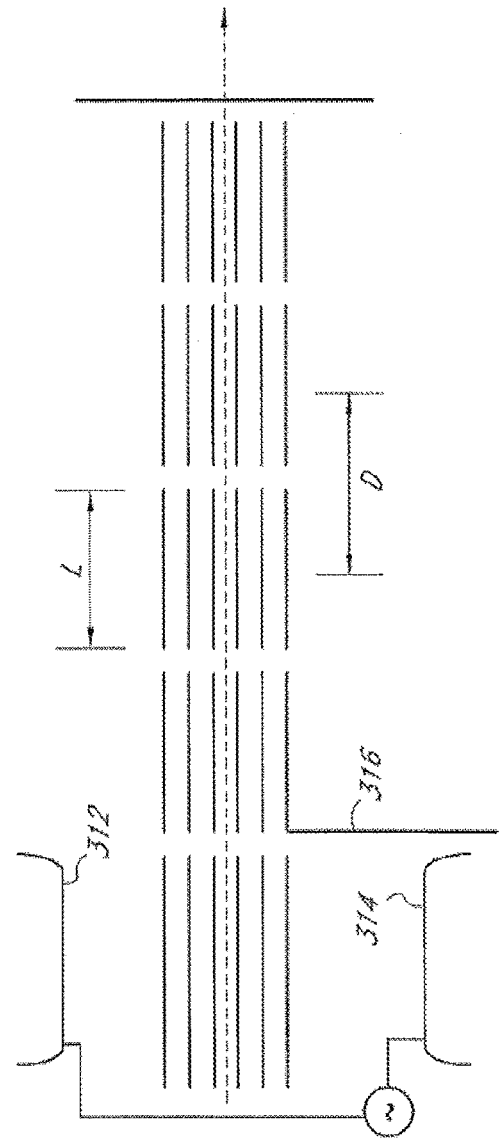
FIG. 3D schematically illustrates a prior art beam blanker.

FIG. 3C schematically depicts a stream of charged particles traveling through a beam buncher. A potential can be applied across the electrodes 302, 304 of the beam buncher that are separated by buncher gap G. If unaltered thereafter, the charged particles begin to form groups whose length L and separation (spacing) D depend on how far the charged particles have traveled after passing through the beam buncher. The beam buncher can be configured to compress the charged particles into groups during travel or to apply an electric field to longitudinally compress the groups of charged particles. The charged particles are preferably fully compressed in the longitudinal direction when they reach the workpiece 101 (e.g., as depicted in FIG. 3C). The energy applied by the buncher can be determined by the difference between the initial energy of the stream of charged particles and the final energy of the temporally and spatially resolved groups of the charged particles.

The beam buncher can comprise a plurality of buncher electrodes and therefore a plurality of buncher gaps. The potential can be selectively applied across two of the electrodes in order to change the characteristics of the digital beam. For example, a potential can be applied across electrodes with a buncher gap G of 1 m to create nodes with a lower charged particle density and applied across electrodes with a buncher gap G of 3 cm to create nodes with a higher charged particle density.

The relationships between beam buncher input parameters such as beam energy and buncher current, frequency, and gap length and beam buncher output characteristics such as separation D, length L, and density are well known. The beam buncher is preferably operated to provide a given number of charged particles per group. First, the buncher gap, frequency, and beam energy can be held constant while the current is adjusted. Second, the beam energy and buncher current can be held constant while the buncher gap and frequency are adjusted. Other operation configurations are also possible.

The beam buncher can comprise a helical coil that is modulated with a current frequency, resulting in a magnetic field. The longitudinal spacing ("gap") between turns of the coil, the magnitude and frequency of the applied current, and the time of flight (TOF) of the charged particles through the column 200 determine the final characteristics of the digital beam at the surface of the workpiece 101. For example, the frequency and longitudinal spacing between turns of the coil can be configured to match a mean velocity of the digital beam.

Bunching charged particles allows write strategy optimization with dose variations at the charged particle level by varying the beam buncher frequency, amplitude, I and duty cycle, which in turn varies the charged particle density, as described above. The beam buncher parameters are therefore preferably adjusted according to the write strategy.

The beam digitizer 206 can comprise a beam blanker (e.g., a beam blanker that can operate at speeds sufficient to create a digital beam). For example and without limitation, the high speed blanker may comprise an aperture plate configured to absorb the charged particle beam at certain interval. The aperture plate is initially positioned such that the stream flows through the aperture in the aperture plate proximate to an interior edge of the aperture plate. An electrode is configured to deflect the stream into the aperture plate, which intercepts the flow of particles to create a temporally and spatially resolved digital beam. An aperture plate 316 is positioned proximate to the stream of charged particles. The electrodes 312, 314 are configured to apply a potential to the charged particle stream to create temporally and spatially resolved groups of charged particles of the digital beam. If unaltered thereafter, the charged particles continue to travel with length/and separation D regardless of how far the charged particles have traveled after passing through the high speed blanker.

Other embodiments of the beam digitizer 206 are also possible. In some embodiments, the beam digitizer 206 is configured to modulate an on/off state of the charged particle source 202. In some embodiments, the beam digitizer 206 is configured to modulate a position of the charged particle source 202 longitudinal to the axis so as to displace the groups of charged particles.

The beam digitizer 206 can be configured to apply electromagnetic radiation, for example with a frequency of between about 1 megahertz (MHz) and 100 gigahertz (GHz) or between about 1 MHz and 25 GHz. The beam digitizer 206 can be configured to modulate, for example, the amplitude. of the electromagnetic radiation, the frequency of the electromagnetic radiation, combinations thereof, and the like. The beam digitizer 206 can also be configured to apply a beat wave to a plasma comprising the charged particles, to apply space charges to wake fields, to resonantly absorb the space charges, to blank the beam through an absorption aperture, to apply a pulsed incident neutralizing beam to the charged particle source 202, and/or to apply a pulsed laser beam to the charged particle source 202.

Components described herein can be advantageously combined. The column 200 can comprise a beam blanker downstream of the collimator 204 and a beam buncher downstream of the beam blanker. A digital beam coming from the beam blanker and into the beam buncher can be used to further temporally and spatially resolve the individual groups in the digital beam. The column 200 could comprise a beam buncher downstream of the collimator 204 and a beam blanker downstream of the beam buncher. Other configurations are also possible.

The column 200 further comprises a deflector 210 downstream of the beam digitizer 206. The deflector 210 comprises a series of deflection stages (e.g., electrode stages, magnetic stages) disposed longitudinally along the axis of the digital beam. The deflector 210 deflects individual groups of charged particles in the digital beam. As used herein, the phrase "minor field deflection" refers to the deflection of an individual group of charged particles by the deflector 210. The deflector 210 can be configured to deflect the groups in the digital beam substantially perpendicularly to the axis of propagation. For example, the deflector can comprise between about 1 and 1,000 or four deflection stages or at least one, two, three, or four deflection stages. Each deflection stage can comprise two or more electrodes or four electrodes. Other quantities of deflection stages and electrodes are also possible.

An average or mean velocity of the groups of charged particles in a digital beam can be between about $1 \times 10^4$ meters/second (mis) and $3 \times 10^8$ m/s. Application of potentials by each of the deflection electrode stages can be adapted to be synchronized with the mean velocity of the groups of charged particles passing through the deflector. For example, a deflection electrode stage may be adapted to apply a voltage only when a group of charged particles is passing through the deflector in general and through that particular deflection electrode stage in particular. Application potentials by each of the deflection electrode stages can be adapted to be harmonically synchronized with a mean velocity of the groups of charged. particles passing through the deflector. For example, each deflection electrode stage in at least a portion of the deflector may be adapted to apply a voltage only when a particular group of charged particles is passing through the deflector in general and through that particular deflection electrode stage in particular. Application of potentials by each of the deflection electrode stages can be adapted to be randomly synchronized with a mean velocity of the groups of charged particles passing through the deflector. As used herein, the phrase randomly synchronized is to be given its broadest possible meaning including, but not limited to, synchronization of application of voltage by the deflection electrode stages to groups of charged particles with random spacing or synchronization of application of voltage by random deflection electrode stages to groups of charged particles with random or other spacing.

Electrodes of the deflection stage can apply a substantially equal voltage potential as each group of charged particles of the digital beam passes. The amount of deflection of each group of charged particles depends on the number of electrodes activated sequentially. Variable potentials can be applied to each deflection electrode stage as each group of charged particles passes. For example, the first deflection electrode stage has the smallest voltage with subsequent electrodes have progressively more voltage, resulting in a linear deflection as electrodes are activated. The converse is also possible, where the first deflection electrode stage has the largest voltage with subsequent electrodes having progressively less voltage. The number of deflection electrode stages activated defines the amount of deflection of each group of charged particles of the digital beam. The signal timing and nominal voltages applied to the deflector can be calibrated for individual deflection electrode stages and even individual electrodes within each deflection electrode stage. Triggering an applied voltage of individual deflection electrode stages can be delayed if needed to match the incidence of to each group of charged particles of the digital beam ("phase-matching"), for example due to changes in charged particle velocity, species, and mass, deflection stage position, pattern resolution, pattern field errors, errors within an 'objective deflection field, process specific compensation and write strategies, combinations thereof, and the like. A field perimeter of the deflection electrode stages can be defined as the minor deflection field of less then 4 mm, less than 2 mm, less than 1 mm, or less than 100 m displacement in x or y from the center of the axis of propagation.

The potentials of each of the deflection electrode stages can be adapted to partially displace the groups of charged particles towards an intended trajectory. Each group is partially deflected I/Nth of an intended deflection distance by each of a number N of deflection electrode stages. The first deflection electrode stage, or any single deflection electrode stage, can be adapted to substantially fully displace one or more (e.g., all) groups of charged particles towards an intended trajectory, and the other deflection electrode stages are used to fine tune the deflection of the groups. Other combinations are also possible.

For example, the harmonically synchronized deflector described above, at least a portion of the deflector can comprise N sets of deflection electrode stages, each set of deflection electrode stage comprising N deflection electrodes, in which every Nth deflection electrode stage is configured to displace a particular group of charged particles towards an intended trajectory. If at least a portion of the deflector comprises two sets of deflection electrode stages, every other deflection electrode stage in the sets of deflection electrode stages may be configured to displace a particular group of charged particles towards an intended trajectory. If at least a portion of the deflector comprises three sets of deflection electrode stages, every third deflection electrode stage in the sets of deflection electrode stages ma)'. be configured to displace a particular group of charged particles towards an intended trajectory. Other variations and configurations are possible.

Figures 6A, 6B:
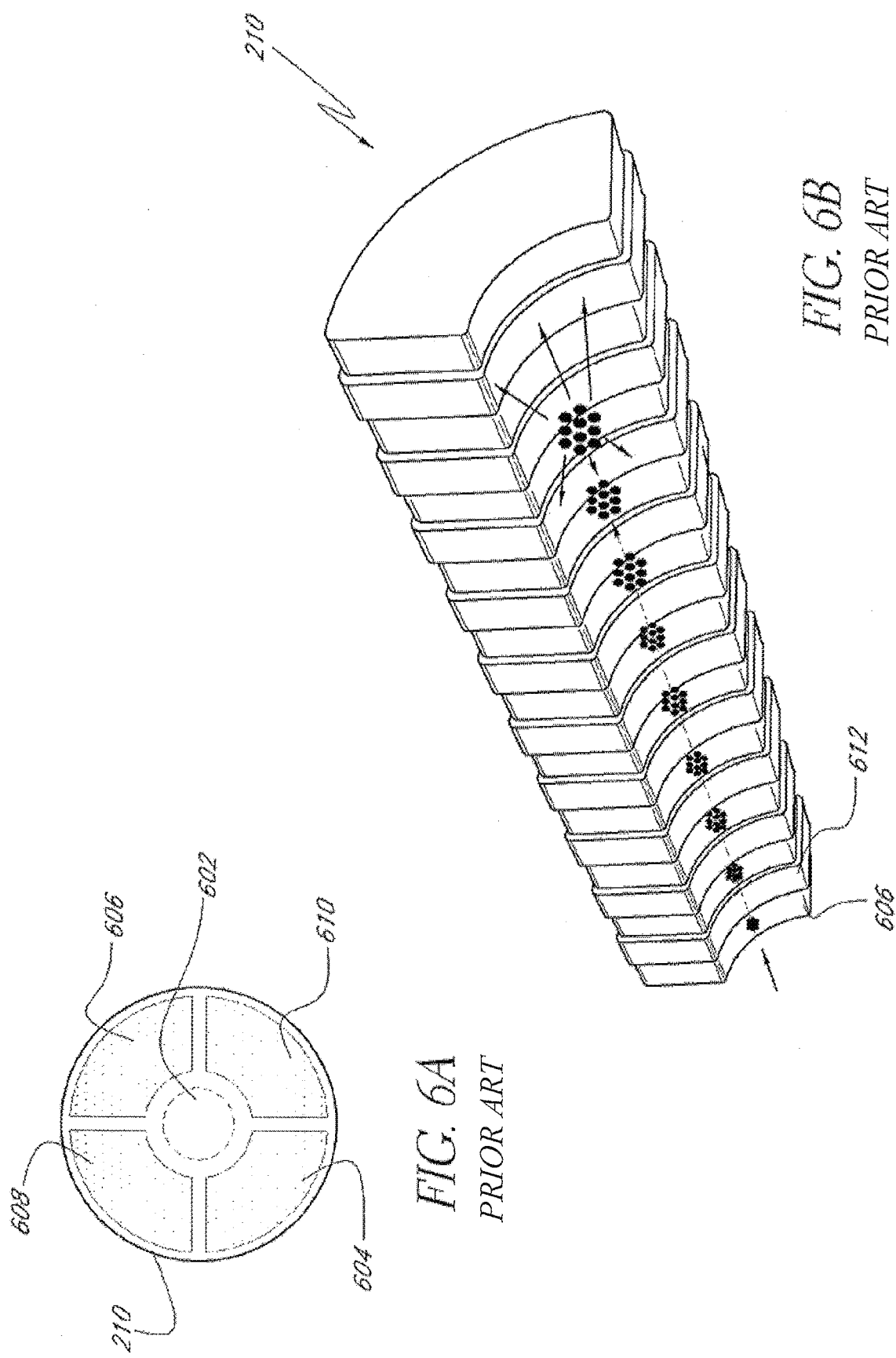
FIG. 6A depicts a top schematic view of a deflector.
FIG. 6B is a perspective quarter cut-away view of the upper right quadrant of the deflector of FIG. 6A.

FIG. 6A depicts a top schematic view of a deflector 210 comprising at least one electrode in each deflection electrode stage. The digital beam comprising charged panicles is configured to flow through the center aperture of the deflector 602. The sets of electrodes 604, 606 and 608, 610 may be positively or negatively charged such groups of charged particles are deflected perpendicularly to the longitudinal axis of the deflector and the path. Preferably, the electrodes on opposing sides, for instance, electrodes 604 and 606, are oppositely charged. FIG. 6B is a perspective quarter cutaway view of the upper right quadrant of the deflector 210. The electrodes 606 are separated in this embodiment by an insulator 612. Examples of insulator materials include $SiO_2$, $SiN_x$, $SiO_xN_y$, combinations thereof, and the like. It will be understood that rather than a single deflector comprising a plurality of deflection electrode stages, the deflector 210 may comprise a series of deflectors, each comprising one or more deflection electrode stages. For example, a deflector 210 may comprise three sets of deflectors. As illustrated in FIG. 6B, the groups of charged particles are deflected by each deflection electrode stage as they travel along the path. Other deflector and electrode configurations are possible.

Figure 7:
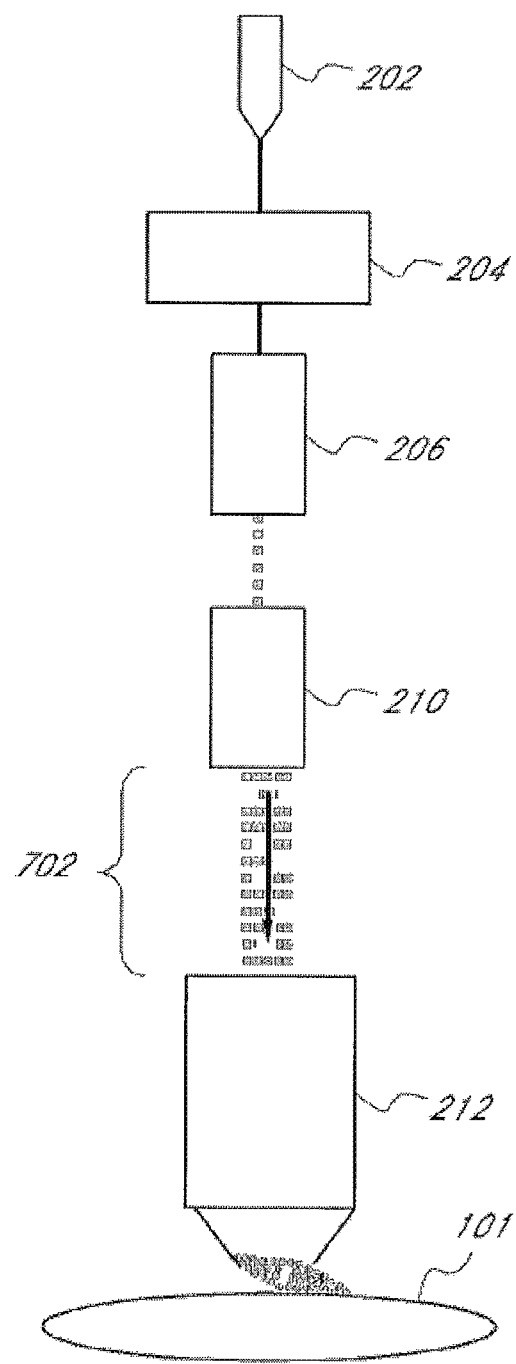
FIG. 7 is a schematic block diagram of another example charge particle column.

In certain embodiments, the deflector 210 is configured to arrange the groups of charged particles into a three-dimensional time space (an "adaptable virtual digital stencil"). In certain embodiments, the deflector 210 is adapted to create a laterally distributed pattern of the groups of charged particles. In some embodiments, the deflector 210 further comprises a deflector lens adapted to demagnify the pattern or the virtual stencil. The deflector lens i:nay comprise an electrostatic lens, an electromagnetic lens, a reflective lens, a combination reflective and refractive lens, a combination reflective and deflective lens, a combination deflective and refractive Jens, combinations of the same, and the like. FIG. 7 is a schematic block diagram of a column 200 in which the groups of charged particles coming out of the deflector 210 are arranged in a visual digital stencil 702, each group of charged particles having undergone a minor field deflection. The objective lens assembly 212 is configured to deflect the virtual stencil with a major field deflection. The combination of minor field deflection, major field deflection, and movement of the workpiece 101 can be used to expose a pattern of charged particles on the workpiece 101.

In certain embodiments, a phase of the groups of charged particles of the digital beam longitudinal to the axis is configured to be substantially equal, single harmonic, multiple harmonic, random, combinations thereof, and the like. The spacing between the deflection stages may be adapted to be synchronized and to be in phase with the groups of charged particles. In some embodiments, longitudinal positions of the deflection electrode stages are adjustable. In some embodiments, the deflector 210 comprises a digital feedback system, for example to adjust the spacing between the deflection electrode stages. Piezos, etc. may be used to position the electrodes or deflection stages.

In some embodiments, the column 200 further comprises an objective lens assembly 212 disposed between the deflector 210 and the workpiece stage 214. The objective 212 may comprise a lens, a mirror, a reflective optic, a combination reflective optic and refractive lens, a combination reflective optic and deflection electrodes, a combination deflection electrode and refractive lens, combinations of the same, and the like. In some embodiments, the objective lens assembly 212 comprises a detractive lens assembly or a deflector electrode assembly configured to demagnify, focus, and/or deflect the groups of charged particles or the adaptable virtual digital stencil. For example, in certain embodiments and without limitation, groups of charged particles having a diameter (or "spot size") of about 200 nm are reduced I 0 times to a diameter of about 20 nm. The objective lens assembly 212 may also be adapted to demagnify the groups or the stencil by 100 times or 1,000 times. In embodiments in which the objective lens assembly 212 is configured to deflect a virtual digital stencil, the deflection may be called a "major field" deflection. In some embodiments, a field perimeter of the objective lens assembly 2 J 2 is defined as the major deflection field of less then 10 mm, less than 5 mm: Jess than 1 mm, or less than 100 m displacement in x or y from the center of the axis of propagation. In certain embodiments, the exit aperture comprises an exit aperture.

Referring again to FIG. 2, the exposure chamber 102 comprises a workpiece stage 214 downstream of the lower objective lens assembly 212. The workpiece stage 214 is configured to hold the workpiece 101. Preferably, the workpiece stage 214 comprises an interferometric stage, wherein the relative position of the stage is measured using optical interference. The workpiece stage 214 may be thermally controlled to reduce magnification errors in the workpiece, which can lead to overlay errors. The workpiece stage is preferably configured to continuously move while a workpiece 101 is exposed to the groups of charged particles. For example, the workpiece stage 214 may be configured to move continuously over a dimension of 25 centimeters over a period of 1 second during exposing. For another example, the workpiece stage may be configured to move without stopping for more than 5 nanoseconds per 0.5 seconds during exposing. The ability to continuously expose while moving the workpiece stage 214 without stopping can yield increase efficiency and throughput.

In certain embodiments, the workpiece stage 214 comprises an interferometer configured to determine the location of the workpiece stage 214 in a horizontal plane. The relative x/y position of the stage can be measured using optical interference. Other methods are also possible, for example the workpiece stage may comprise a registration mark, grid, or feature detectable by a secondary ion mass spectrometer (SIMS), backscattered electronics, or faraday cup disposed below the registration grid. The registration. mark is preferably included in an assembly that can be moved parallel to the column 200 in order to optimize a working height of the registration mark to the workpiece, thereby reducing column calibration and registration errors. The digital beam may periodically or randomly be directed towards the registration mark to check the alignment of the column. The registration mark may also be used to calibrate the column 200 before, after, and/or during exposing a workpiece.

In some embodiments, the chamber 102 further comprises a height control system that measures the height of the workpiece stage 214 and/or a registration mark. The height control system can include, for example, a laser and a plurality of detectors configured to receive light emitted from the laser and reflected by the workpiece, the workpiece stage 214, and/or a surface that moves with the workpiece. The height control system can compensate for variation in the measured height of the workpiece stage by adjusting an elevation of the stage, for example by using electrostatic clamps, piezoelectric devices, etc. In some embodiments, the height control system is configured to compensate for height variations of less than J μm. Electrostatic clamping may be used to secure the workpiece to the workpiece stage 214 and to ensure adequate thermal contact and flatness of the workpiece.

Full motion writing (FMW) can eliminate the workpiece stage motion overhead time while exposing a workpiece. In FMW, the deflector 210 system is updated in real time to track the motion of the workpiece stage 214, thereby allowing the system to write patterns while the workpiece stage is in motion. Such a process preferably uses a high speed optical controller (e.g., laser) to track the position of the workpiece stage 214. For example, circuitry on the controller can convert Doppler-shifted laser deflection measurement& into laser pulses that can be stored in a stage position register. Interferometry, laser deflection measurements, or other optical techniques can be used to track the position of the workpiece. Therefore, the throughput of lithography systems can be improved by reducing or eliminating non-exposure time during stage repositioning and settling sequences.

While exposing a workpiece, each deflection field center is defined by a window of opportunity (WOO). While the workpiece stage is in motion and a reflection field passes over an unwritten WOO, a stage controller signals a deflection controller to initiate exposure. The workpiece is exposed while the undeflected beam center passes through the WOO. Within the WOO, the deflection system can deflect to the outer limit of the field. During this time, the deflection system is updated by the workpiece stage position register of the actual location of the workpiece stage.

Figure 4B:
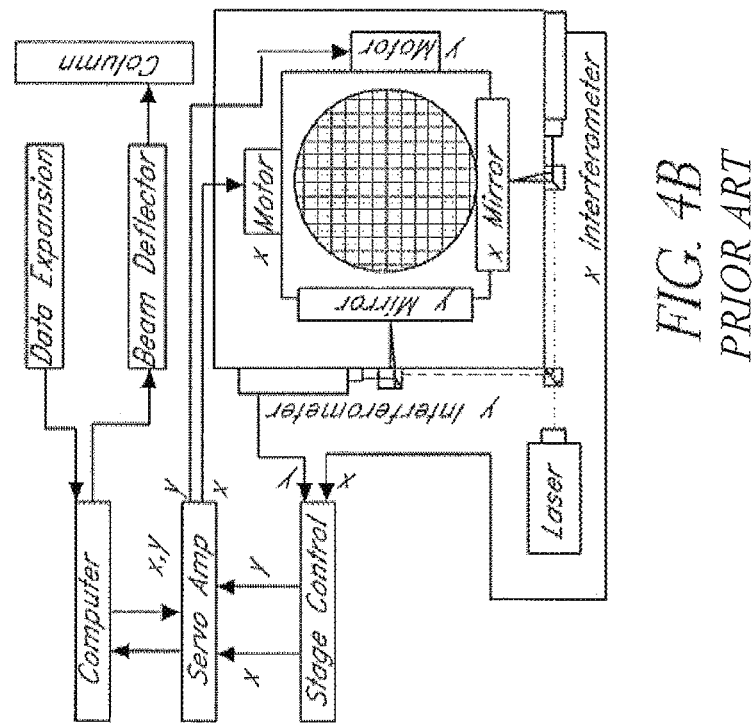
FIG. 4B is a schematic block diagram of an example workpiece stage and control electronics.
Figure 4A:
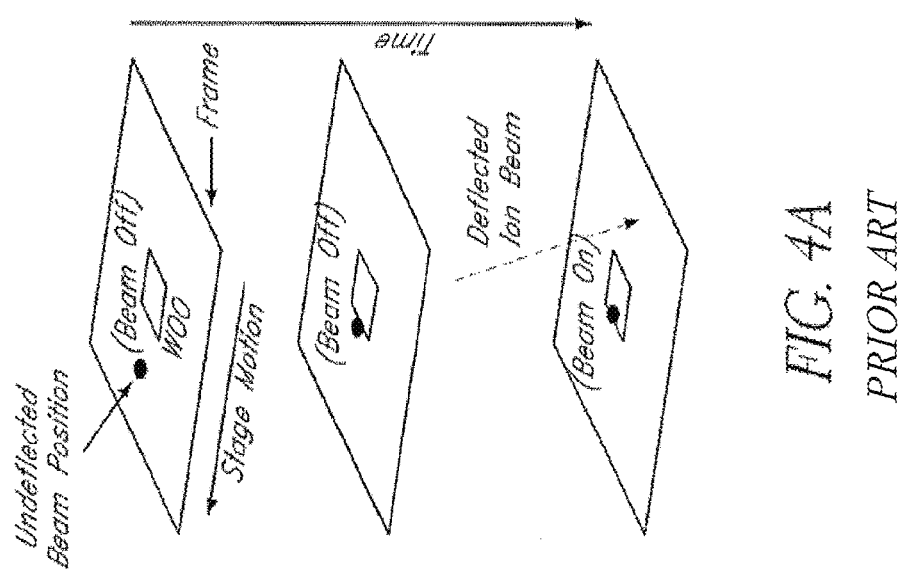
FIG. 4A illustrates an example writing strategy over a period of time.

The workpiece stage can allow real time deflection correction. By changing the WOO size or frame size, or by smoothing the frame-by frame pattern data, the system can be dynamically optimized for continuous writing. A typical frame/WOO density is depicted in FIG. 4A.

The workpiece stage may be configured to provide suitable velocity performance, for example at 100 centimeters per second. The workpiece stage may be configured to rotate a workpiece during exposure at up to about 40,000 rotations per. minute (rpm). For example, the workpiece stage may have as little inertia as possible, and a compatible workpiece stage motor design can be provided. The use of vacuum compatible air bearing rails and linear motor drives can provide adequate decoupling of vibration sources. As additional examples, the workpiece stage motors can be placed in the vacuum system, light weight materials can be used for the workpiece stage, and the workpiece can be aligned on the stage, thereby eliminating the workpiece cassette and cassette clamping hardware. Additionally, the first three derivatives of stage position (velocity, acceleration, and jerk) can be limited and damped by electronic hardware to properly control the motion of the workpiece stage. FIG. 4B is a schematic diagram of an example workpiece stage and control electronics.

The exposure chamber I 02 may be in communication with control electronics, for example system support electronics 220 including wafer handler control, vacuum control, suspension control, temperature control, pressure control, etc. and column support electronics 230 including a source control module, digitizer control, deflector control, lens control, wafer height sensor, video processor, stage control, and a dynamic corrector (e.g., for real time column aberration correction). The column support electronics 230 may be in communication with data process electronics 240, for example a workstation.

An example application of the systems described herein is to perform in situ workpiece processing or resist exposure by directly writing on the workpiece. Preferably, accurate registration of optics to the target workpiece is achieved, but tool induced shift (TIS) and workpiece induced shift (WIS) errors may be introduced due to temperature effects, workpiece processing effects, and optical distortions. An example solution is to measure an initial pattern (e.g., one or more alignment marks) on the workpiece is and to use the measurement data to accurately place a newly patterned image onto the workpiece, for example by adjusting the exposure parameters.

A registration sensor preferably can automatically detect and recognize a variety of registration and alignment mark patterns, materials, and profiles without impacting the quality of exposure throughput. Examples to achieve such a sensor include, but are not limited to, using a high resolution, high speed registration system with existing hardware, determine the limitation and flexibility of the registration strategy (e.g., by mapping the workpiece with die-to-die registration) and the incorporating a temperature conditioning stage, and introducing a high speed moire (grating) interferometer system for die-to-die registration, combinations thereof, and the like. Other approaches are also possible.

A high resolution, high speed registration system can employ existing hardware and can be similar to existing electron beam registration, but a plurality of imaging modes can be used. Scanning the surface of an object (e.g., a registration or alignment mark) with a digital beam produces secondary electron emission, secondary ion emission, and ion sputtering. A bi-axial or cylindrical microchannel plate can be used to detect both secondary electrons (e.g., by biasing above the voltage of the target) and the secondary ions (e.g., by biasing below the voltage of the target). Other configurations are also possible. An image can be created by measuring a signal yield of the secondary ions and secondary electrons at each point where the beam impacts the target. Variations in the yield indicate changes in surface topology or composition of the workpiece. The position resolution of this signal is a product of the measured beam spot size and deflection pixel size during registration and is augmented by statistical metrology. Sputtered ions provide greater mark recognition ability I because such ions can be collected and mass analyzed secondary ion mass spectroscopy (SIMS). SIMS registration techniques are well developed and can be used both for mark detection and for process development diagnostics. An atomic map with the spatial resolution of the beam spot size can provide excellent precision for mark detection.

To optimize registration, a product summation of the detector video signal with a computer generated image of the registration or alignment. mark can be used to enhance or recover an otherwise unrecognizable target signal from high-noise background. This can be performed by automatically correlating the video gain and bias offset for an initial signal enhancement. Once the tone is properly adjusted, the signal can be correlated with a computer generated (CAD) image of the registration or alignment mark to provide an enhanced image of the mark. Other signals are detectable from digital beam mark interaction. Signals such as those from secondary electrons and backscatter electrons may be used for this process. Additionally, signals from secondary electrons and backscatter electron may be employed differentially to improve detection limits (e.g., signal to noise ratios). For example, the final detection signal may be the difference between SIMS and other signals. The speed of registration may be limited by the quality of the registration electronics, but incorporating modern electronics (e.g., digital signal processing (DSP)) may reduce the registration time by orders of magnitude without burdening registration resolution.

Another consideration in the quality and speed of registration is the configuration used to register to the workpiece prior to exposing. Depending on the preconditioned and in-process temperature stability of the workpiece, several strategies are available to compensate for distortions and throughput issues. Workpiece mapping generally registers a single die, providing reduced or minimum overhead to the system throughput but no correction for pattern distortion caused by temperature instability during exposing. Die-to-die registration performed immediately prior to die exposure, for example to minimize temperature distortion effects, generally uses four registrations per die per level. Such a technique eliminates the ability to write in a serpentine mode, drastically limiting the throughput of the system by memory load overhead time. However, performing registration on a plurality of dies at one time can maintain the ability to write in a serpentine mode within a field comprising the plurality of dies, thereby allowing increased or maximum throughput while reducing or minimizing pattern distortion.

Overlay accuracy becomes increasingly important as device geometries shrink. For a digital beam tool, the direct exposure of multilevel patterns on a single workpiece for manufacturing of integrated circuits desirably. includes accurate intra-layer registration. An example workpiece alignment technique has three features: adequate signal generation from the surface impact of the digital beam; a detection algorithm for processing the detected signal; and an alignment feature fabrication technique.

The, impact of a charged particle onto the workpiece can create media such as secondary electrons, backscattered electrons, photons, and secondary ions, each having certain advantages in detection efficiency. However, selection of a particular media for registration purposes depends on the charged particle species, the charged particle energy, and the current density of the beam. A signal detector may be optimized for a given media. For example, an electron-photomultiplier is generally appropriate for secondary electrons, a solid state diode is generally appropriate for backscattered electrons, and secondary ion mass detectors are generally appropriate for photons and secondary ions.

A digital signal processor processes information from the signal detector in order to determine the location of the alignment mark. A traditional method of detection includes a one-dimensional line scan with the digital beam. As the digital beam transitions by deflection across the alignment mark, the detected video signal. is modulated. Modulation occurs because differences in the alignment mark and the contour of the workpiece. Actual alignment mark location can be determined by processing the distribution of the modulated signal via a digital signal processing module. Another detection method includes an X/Y scanning mode of the digital beam to acquire a video image of the alignment mark. To achieve accurate edge detection, digital signal processing algorithms are applied. Improved detection of the alignment feature edge is accomplished through a two-dimensional imaging method that averages several frames of video data and determines the actual location of the alignment mark by gray scale signal processing.

Preferably, alignment marks are formed over the entire working area of the workpiece in the form of equally spaced two-dimensional grids. One construction method is the formation of a raised multilayered semiconductor structure consisting of layers of silicon, silicon dioxide ($SiO_2$), and polysilicon, with an alignment mark formed on the polysilicon layer of the wafer. In another construction method, an alignment mark is etched into the surface of a silicon wafer and a layer of a heavy metal (e.g., tantalum or tungsten) is deposited into the trench. The alignment mark containing the heavy metal exhibit a high level of backscatter relative to a silicon substrate, thereby providing contour details for low energy backscatter ion detection. Selection of an appropriate alignment feature construction method depends on the signal media and the signal detector, dictated by process steps.

A minimum of three alignment marks are preferred in order to accurately identify translation, rotation, and magnification errors. The measured errors are fed back to the workpiece stage control system for correction, thereby reducing workpiece and tool induced shift errors. The processing of global alignment marks may permit faster and more accurate detection of localized alignment marks by removing gross errors. The alignment process can be repeated whenever the workpiece is inserted into the exposure chamber, whenever the workpiece is removed from the apparatus, between significant process steps, etc. Other techniques can also be used.

Patterning tools transfer large quantities of microelectronic circuit pattern data in a format that can be manipulated (e.g., converted from digital to analog) within small periods of time (e.g., nanoseconds). The data is typically in a format for very large scale integration (VLSI) computer aided design (CAD), as described below. This data is used, for example, to control the deflection by the deflector 210, the deflector lens, the objective lens 212, and/or movement of the workpiece stage 214 and can be adjusted to address aberrations in the optics. Charged particle exposure chambers may have imperfections (e.g., aberration, deflection errors), for example due to manufacturing or installation imperfections and the physical constraints of the optics. As an example, if a system is installed with a slight rotation relative to the workpiece stage 2 I 4, beam deflections will be rotated relative to the motion of the workpiece stage 214. More complex errors may also be present; for example, an attempt to trace the outline of a large square with the beam may produce a pincushion or barrel shaped pattern. The magnitude of these effects is proportional to the magnitude of deflection of the digital beam, which can limit the size of the deflection field and can create nonlinear distortions in system writing quality. High resolution writing using a digital beam is therefore preferably able to augment transformed pattern data to compensate for deflection field distortion, wafer distorted pattern placement errors, stage position, etc.

Additionally, processing errors may be introduced. Pattern distortion or deflection distortion can result from several factors when exposing a workpiece with a digital beam. For example, thermal fluctuations in the exposure chamber 102 or in a workpiece 10 I can cause magnification errors. For another example, securely clamping the workpiece 101 to the workpiece stage 214 can also cause rotational errors or can induce stresses resulting in pattern sheering. For yet another example, unrecoverable nonlinear pattern distortions can result from subsequent processing such as rapid thermal annealing. For still another example, manufacturing or installation of the optics may be imperfect (e.g., with a slight rotation relative to the workpiece stage) and the optics have certain physical constraints. More complex errors may be introduced by certain processes, for example and without limitation, tracing a large square with the digital beam may result in a pincushion or barrel shaped pattern. The magnitude of the errors may be proportional to the magnitude of the beam deflection such that they ca~ limit the size of the deflection field and can create nonlinear distortions in system writing quality. The adaptable virtual digital stencil is in softcode at any given point in time. As such, the stencil is temporally and spatially adaptable to correct in real time for nonlinear pattern offset, gain, rotation, and corrections within the minor field, while being deflected in the major field. These corrections can be performed within features, die, or to the entire workpiece.

Digital beam lithography systems preferably can perform pattern and beam corrections to compensate for processing-induced errors on the workpiece and optical errors (e.g., coma distortion, astigmatism, image pure distortion, chromatic aberration, spherical aberration, field curvature, etc.). Such corrections can improve writing quality and enhance system throughput.

Figure 4C:
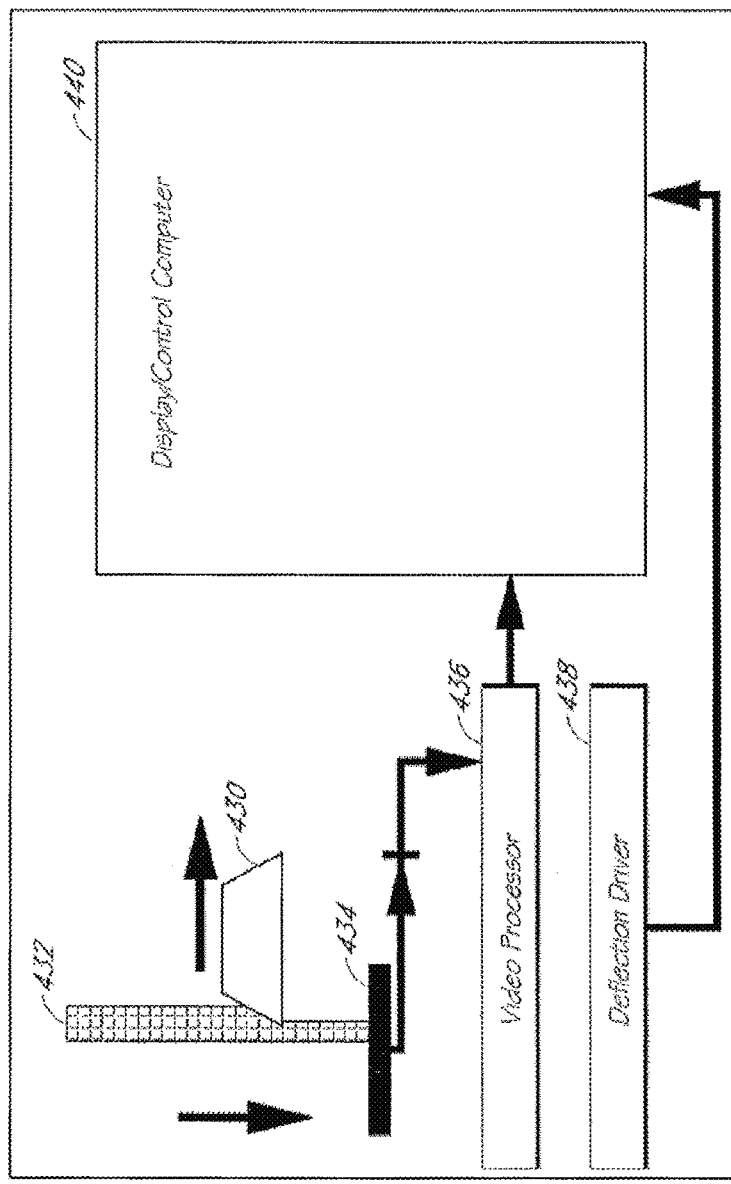
FIGS. 4C and 4D is a schematic block diagram illustrating an example beam measurement technique.
Figure 4D:
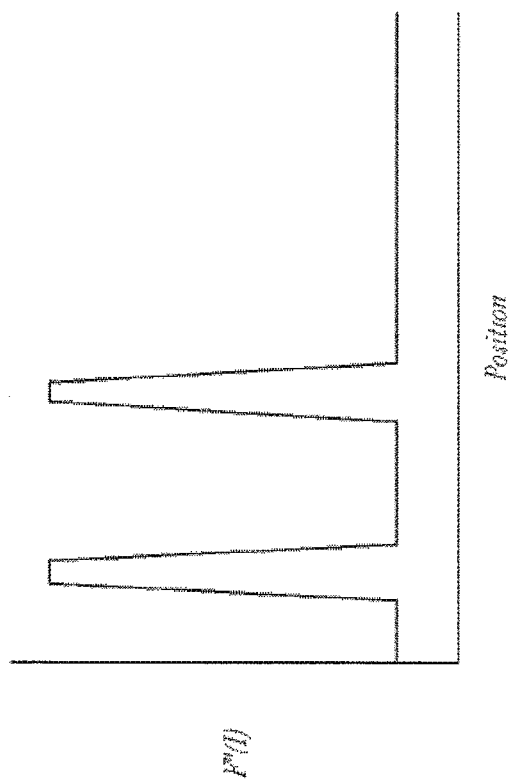

Pattern and deflection distortion problems can be corrected by incorporating data manipulation bias electronics (hardware and software) into the system. For example, process control software can use metrology measurements to correct the deflection of the digital beam. Such metrology measurements preferably are made prior to exposing the workpiece. The quality of the digital beam may initially be optimized to provide improved or optimum measurements from subsequent metrology. In some embodiments (e.g., as depicted by FIG. 4C), a knife-edged micromesh grid is placed over a diode detector, which is scanned by the digital beam. The second derivative of the beam current with respect to the scan position provides a high resolution beam profile (e.g., as depicted by FIG. 4D). Optimization (e.g., automated optimization) of the beam profile with the optics control system allows focusing of the beam.

Once the digital beam has been optimized at small or minimum deflection angles, the system can correct the digital beam profile within a larger usable deflection field by moving the workpiece stage 214 to a plurality of positions within the outer limits of the distorted deflection field. The digital beam is then deflected to the position where the grid is scanned for beam optimization. The sequence is repeated over an extended size of the deflection field. Beam optimization data can then be correlated with an interferometer or other position monitoring system of the workpiece stage 214. In certain embodiments, the linear contribution of the error is stored as an argument, while the nonlinear error is stored as pure memory. Beam distortions that depend on the position of a minor field within a major field can also be correlated. Within the minor field, use of the grid to calibrate deflection distortions can be performed without moving the workpiece stage by major field deflection of the adaptable virtual digital stencil to fit the scans on the grid. As a result, automated optimization or improvement of the beam profile can be performed within an extended deflection system, thereby allowing improved writing quality and throughput performance.

A final measurement can be made prior to exposing portions (e.g., individual dies) of the workpiece 101 because the workpiece 101 may be rotated or distorted as a result of temperature or stress effects caused by processing. If a pattern is being written o~ a workpiece 101 that already contains previous pattern levels, the new level can be adjusted to overlay on the previous levels, for example by registering to three or four corners of the die and then applying a magnification or rotational correction within each die. For example, the calibration software may automatically measure features on the edges of each die prior lo exposure and use the measurements to correct for any pattern displacement, magnification, or rotation caused while aligning, processing, or handling the workpiece.

As described above, the exposure chamber 102 can be operated by providing integrated circuit (IC) design data, for example in the form of CAD schematics, to generate and expose the pattern on the workpiece. Users of the apparatus 100 input a desired pattern to be written, along any specific alignment configurations and/or processing parameters. Once the design for a device (e.g., an integrated circuit) is developed, multiple pattern layers of the design can be laid out to cover the workpiece as desired (e.g., to cover the entire workpiece). A complete exposure data preparation (EDP) package with a user interface can be used to convert raw designs (e.g., in CAD or graphic data system (GDSII)) to a format usable by the exposure chamber 102 (e.g., exposure ready format (ERF)). Prior to loading pattern data onto the system, several format changes, such as compressing and merging similar pattern features and reducing overlapping routines, can be made to increase or maximize throughput of the exposure chamber. Once the pattern data has been compressed to a reduced or minimum size, a field partition routine can define the major and minor deflection fields of the pattern data and use a smoothing routine to normalize the density in each data frame. Normalization reduces stage jerking when writing repetitious adjacent multiple density patterns. After registration as described above, the pattern is laid out on the workpiece, using the registration data to calibrate the intended beam pattern to the actual workpiece pattern and to apply any compensation to improve overlay accuracy.

In various embodiments, for example pattern data in GDSII, OASIS, or other suitable formats is input into the system. The input data is then fractured into subfields and identified as to whether they are to be "written" or "non-written." The mapping of the written subfields is sent to a data path module for rasterization (e.g., conversion to a bitmap). Throughput improvement is achieved by moving the workpiece stage and deflecting the beam from one written subfield to a non-adjacent written subfield without exposing non-written subfields. No time is spent processing non-written subfields without pattern data.

Various deflection technologies can be used to expose a workpiece to charged particles. Raster scan is a scanning mode in which the beam moves back and forth over the entire workpiece; the beam is turned on over designated areas and is turned off until the next designated area. Vector scan is a scanning mode in which the digital beam scans only selected areas where pattern is to be placed; after scanning of the selected area is completed, the beam is turned off and moved to selected area to be scanned. Hybrid vector raster technology utilizes a vector approach for major field deflection between data pattern subfields and uses a raster scan technology to deflect a Gaussian or shaped digital beam within the subfield. Throughput improvement can result from only moving the workpiece stage to positions that receive exposure. Another form of 'vector-raster includes a vector deflection in the major field, a vector deflection between pattern features within the minor field, and a raster image of the feature within the minor field. The vector capability of a vector-raster system can provide higher throughput versus a pure raster scan system, and the raster capability of the vector-raster system permits good pattern fidelity and high current with a small dwell time.

As described above, in certain preferred embodiments, minor field deflection of the digital beam is accomplished through a deflector, which is possible because that the longitudinal spatial and temporal spacing of the groups of charged particles permits the individual deflection of each group. In certain embodiments, the voltage applied to each deflection electrode stage is timed to match the velocity of each group of charged particles.

Spacing between groups of charged particles can effectively provide blanking. In particular, such blanking between groups effectively uses the full flux of a continuous or nearly continuous charged particle stream. The temporal spacing between groups allows for deflection error correction (error correction signal summing can compensate—for stage disposition, deflection aberrations, optical aberrations, and write mode process adjustments). Throughput improvement can be achieved by maximizing the time that the digital beam exposes the workpiece.

In certain preferred embodiments, the digital beam is capable of performing a plurality of pattern exposure strategies. Such strategies may be designed to modify exposure dose, species, pattern quality, beam energy per group of charged particles, beam energy for sets of groups, and beam energy for an adaptable virtual digital stencil. The apparatus may also be capable of discretely modifying exposure dose, species, pattern quality, beam energy per group of charged particles, beam energy for sets of groups, and beam energy for an adaptable virtual digital stencil within a particular writing strategy to optimize that particular writing strategy for a particular process.

In an embodiment of a writing strategy, the beam is scanned in raster fashion across the entire area of the workpiece. In certain embodiments, the spot size of the beam is greater than the grid spacing in the raster (e.g., as depicted by FIG. 21A). In certain embodiments, the spot size of the beam is substantially equal to the grid spacing in the raster (e.g., as depicted by FIG. 21 B). That is, the pattern is vector scanned in the major field, vector scanned in the minor field, and raster scanned in a single pass within the feature to be exposed. Feature processing with a digital beam can leverage the per pixel dose variation to improve feature edge quality when performing etch, implant, and deposition. In some embodiments, a digital beam spot size to pixel ratio greater than one can average placement of the groups of charged particles and can reduce exposure process errors. A large digital r beam spot size to pixel ratio improves line edge roughness and allows a higher dose deposition due to cumulative dosing from overlapping beams. This process can also be performed with or without resist.

In another embodiment of a writing strategy, alternating row and column exposure is performed with a large spot size and small pixel size ratio. Exposing alternating pixels with a digital beam produces a pixel exposure width half as wide as the selected feature, thereby increasing the feature critical dimension over target value in both axes (e.g., as depicted in FIG. 21C). That is, the pattern is vector scanned in the major field, vector scanned in the minor field, and raster scanned in alternating pixels in both x and y directions with a single pass within the feature to be exposed. Throughput is increased by effectively reducing the number of charged particles per flash, but at the cost of critical dimension control. There are advantages to using this write mode for a digital beam, such as the ability to apply per pixel dose variation or multiple species exposure to improve device performance, feature edge quality, and throughput when performing resistless. etch, implant, and deposition processes. The throughput improvement can be dramatic since system throughput increases as the square of the effective writing grid. This process can be performed with or without resist.

Yet another embodiment of a writing strategy divides pixel spaced matrices (or "composites") and overlays exposure of a combination of composites interleaved in a series of passes, with each pass offset from other passes in both the x and y directions by a fraction of the writing address. That is, the pattern is vector scanned in the major field, vector scanned in the minor field, and raster scanned in a series of passes that interleave the pixels within the feature to be exposed. The. beam size can be set 25-100% larger than pixel size in order to average out the flashes and to reduce the number of charged particles per group (e.g., as depicted in FIG. 21D). A larger beam spot size versus pixel size helps reduce line edge roughness by averaging systematic errors to allow a higher dose deposition (e.g., as depicted in FIG. 21E). There are advantages to using this write mode for a digital beam, such as the ability to apply per pixel dose variation to improve feature edge quality when performing direct etch, implant, and deposition processes, thereby improving feature edge quality. This process can also be performed with or without resist. The feature quality is improved, but multiple passes are achieved with little or no effect on throughput.

Yet another embodiment of a writing strategy leverages a sampling matrix having an array of cells of a predetermined input address size. Each pass produces a writing grid defined by the distance between beam placements in a single pass. That is, the pattern is vector scanned in the major field, vector scanned in the minor field, and raster scanned in a series of passes offset in the x and y directions to create multiple offset composite feature patterns that interleave the pixels within the feature to be exposed. The composite of all passes forms the effective exposure grid. The dose of the beam can also be freely varied within the operating envelope of the system. There are advantages to using this write mode for a digital beam, such as the ability to apply per pixel dose variation to improve feature edge quality when performing resistless etch, implant, and deposition processes, thereby improving feature edge quality. This process can also be performed with or without resist with a pixel rate greater than about 400 MHz. A good balance between feature quality and throughput can thereby be achieved. The dose of the beam can also be varied within the process-defined operating envelope of the system. This can be performed with a number of techniques including modulating the duty cycle of a beam buncher. Multiple levels of pixel intensity are provided from 0% to 100% beam intensity. Pixels of partial intensity are used along the edge of a feature so as to locate the edge between the lines of a Cartesian raster scan grid. The dose modulation can be assigned by the user via the pattern data file. There are advantages to using this write mode for digital beam processing, such as the ability to apply per pixel dose variation to improve feature edge quality when performing resistless etch, implant, and deposition processes, thereby improving feature edge quality. This process can also be performed with or without resist. A good balance between feature quality and throughput can thereby be achieved.

FIG. 8 illustrates an example vector-raster write strategy using a digital beam. The workpiece is divided into square pixels I through 44. The beam generally writes in a serpentine motion across the workpiece, from 1 to 4, then from 5 to 12, then from 13 to 22, etc. Each pixel is divided into stripes, and each stripe is divided into fields, which are divided into subfields. The beam generally writes in a serpentine motion across each stripe, field, and subfield as well. Within each subfield, the beam is able to write only where written features exist. Like vector scanning, the digital beam only scans selected areas, but the beam does not need to be turned off to be moved to another area, at least the time the beam is turned off is reduced as the dead space between the groups of charged particles can be used for that purpose.

As device geometries decrease, patterning with accurate overlay is preferably at least one order of magnitude smaller than the minimum or critical dimension. Workpiece processing and handling may induce pattern errors across the workpiece that contribute to placement errors, especially as geometries fall below 0.25 microns. However, serial patterning equipment (e.g., exposure chambers with a digital beam) has the flexibility to correct for these errors by registration and pattern data augmentation. A fully automated metrology program that commands the digital beam to align itself, perform deflection/workpiece positioning calibration, and recognize and correct for wafer pattern distortion can eliminate not only pattern defects at the most recent level, but for other pattern errors, as well.

As previously discussed, beam measurement and laser interferometer systems have accuracies to within a few angstroms. Making use of these measurements, system calibration software can collect the deflection gain, linearity, offset, and rotation for both the major and minor deflection fields. The deflection is calibrated to the laser interferometer system, providing a well-behaved deflection motion and profile of the digital beam within the deflection field. Linear and nonlinear errors of the digital beam profile with respect to the beam deflection can also be measured and corrected. Because each die is registered prior to exposure, temperature compensation can be performed by adding corrections to the pattern software and exposing that die in a corrected state, which allows the system to reduce or eliminate pattern distortions caused by annealing, vacuum radiation drain and evaporation, and improper conditioning.

The flexibility of electronic data preparation (EDP) software allows alterations of the pattern to accommodate processing variability. Pattern editing, tone reversal, and feature biasing provide increased flexibility to the user of the apparatus I 00. In addition, feature bordering, dose by size, and dose by type can improve digital beam assisted chemical etching (DBACE) and digital beam nucleation deposition (DBND) at small geometries.

Preferably, a data manipulation bias system corrects for pattern and deflection distortion, for example by augmenting pattern data applying corrected data to the optics control system. The data manipulator system applies final pattern data biasing prior to optics control, and therefore may include very fast electronics (e.g., the fastest electronics in the system). This system sums pattern data correction, deflection distortion correction, and workpiece stage motion correction to the front end of the optics control system. Digital to analog converters at the front end of the optics control system convert the digital signals from the data manipulator. Once amplified, these analog signals drive the column 200.

Overlay accuracy can limit sub-micron lithography. For example, traditional lithography systems cannot correct for nonlinear pattern distortions caused by wafer processing, which is exacerbated by increased workpiece sizes and reduced device geometries. However, certain digital beam systems described herein can advantageously correct for such. errors because the pattern is not fixed on a reticle, but can change during exposing. The adaptable virtual digital stencil is in softcode at any given point in time. It is therefore temporally and spatially adaptable to correct in real time for nonlinear pattern offset, gain, rotation, and corrections within the minor field, while being deflected in the major field. These corrections can be performed within features, die, or to the entire wafer.

A method of processing a workpiece 101 in the exposure chamber 102 comprises exposing the workpiece 101 to a digital beam of charged particles. In certain embodiments, exposing the workpiece 101 comprises forming a stream of charged particles, collimating and propagating the steam along an axis, digitizing the stream into a digital beam comprising groups (or packets or flashes) comprising at least one charged particle, deflecting the groups of charged particles using a series of deflection electrode stages disposed longitudinally along the axis, demagnifying the pattern, and focusing the demagnified pattern of groups of charged particles onto the workpiece 101. The dosage of exposure is preferably less than about $1 \times 10^{17}$ charged particles/cm$^2$. As described above, digitizing the beam may comprise, for example, beam bunching, high speed blanking, combinations thereof, and the like.

In some embodiments, deflecting the groups of charged particles comprises selectively applying voltages across the deflection electrodes at each deflection electrode stage. Selectively applying the voltages may comprise applying a large voltage with a first deflection electrode stage and applying smaller voltages with other deflection electrode stages. Selectively applying the voltages may also comprise applying a small voltage with a first deflection electrode stage and applying larger voltages with other deflection electrode stages. Selectively applying voltages may also comprise applying approximately equal voltages at each deflection electrode stage. Demagnification of the groups of charged particles preferably produces packet diameters of less than about 200 nm, less than about 50 run, less than about 10 nm, less than about 5 run, or less than about I run. The workpiece stage may move continuously during the exposing process. For example, the workpiece stage may move continuously over a dimension of about 100 cm over a time period of 1 second. For another example, the workpiece stage may move without stopping for more than 5 nanoseconds per 0.5 seconds.

Figure 5:
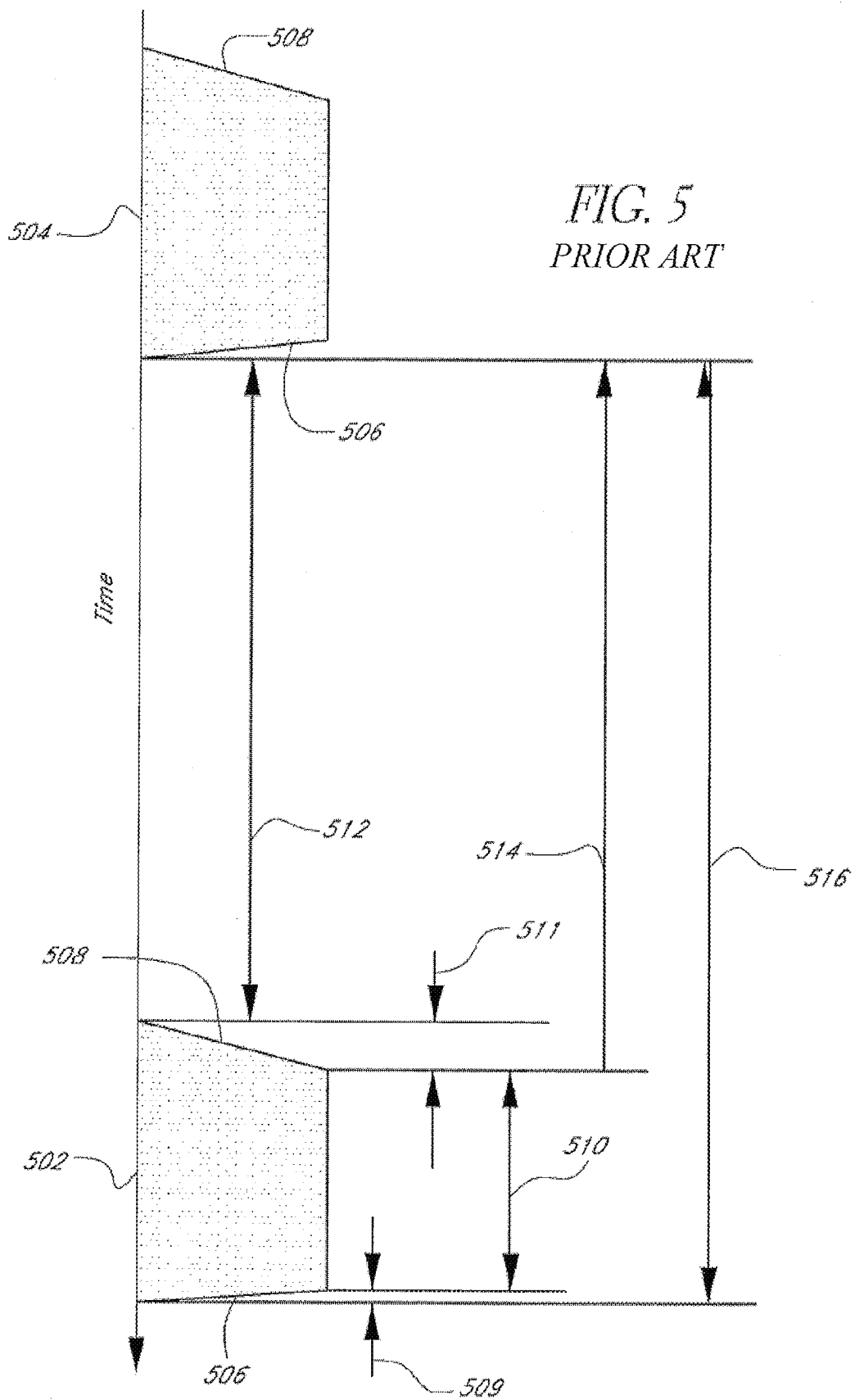
FIG. 5 illustrates example groups of charged particles in a digital beam.

FIG. 5 illustrates a plurality of groups of charged particles 502, 504. In some embodiments, deflection of a group of charged particles occurs during a dead zone 512 at the workpiece such that no exposing occurs during the deflection. The rise time 509 of saturated beam pulses can be used for blank and unblank edges. In some embodiments, the geometry of the groups of charged particles are Gaussian in x and y dimensions perpendicular in time, as well as Gaussian in velocity to, the axis of propagation. In some embodiments (e.g., as depicted in FIG. 5), the groups of charged particles 502, 504 have a trapezoidal cross-section along the longitudinal axis. In FIG. 5, two groups of charged particles 502 and 504 are depicted. Each digital beam has a density distribution rise time 506 and a fall time 508. The time between no charged particles and the peak density of charged particles is the quick pulse rise time 509. The time in which each group 502, 504 has a peak density of charged particles is the digital flash time 510. The time between the full concentration of charged particles and no charged particles is the quick fall time 511. The time in which there are no charged particles is the dead zone 512 (the anti-node region). The time between the last instance of a full concentration of charged particles in a first group, for example the group 502, and the initial concentration of charged particles in a subsequent group, for example the group 504, is the deflection time 514. The time between the first concentration of charged particles in a first group, for example the group 502, and the initial concentration of charged particles for a second subsequent group, for example the group 504, is the flash duty cycle (or "flash spot rate") 516 and is used for feature-to-feature deflection time within the minor field. In some embodiments, however, blanking can occur over multiple duty cycles. A blanker may be used.

Referring again to FIGS. 1A and 1B, the apparatus. 100 may further comprise at least one dedicated process chamber 108. Additional process chambers can optionally be used for advanced processing. The process chambers 108 may comprise any variety of workpiece processing equipment. For example, and without limitation, the processing chambers 108 may comprise etch, deposition (e.g., oxidation, nucleation, etc.), rapid thermal anneal (RTA), combinations of the same, and the like. Some process chambers 108 may be configured to process a workpiece 101 that has been exposed in the exposure chamber 102, while other process chambers 108 can be configured to process a workpiece 101 before or after processing in another process chamber 108, before processing in the exposure chamber 108, etc. In certain embodiments, a process chamber 108 does not substantively change the workpiece 101. For example, a process chamber 108 may comprise a calibration or metrology tool. In certain embodiments, the apparatus 100 comprises a plurality of processing chambers 108 such that a workpiece 101 may be transferred from a bare substrate to a substantially finished product. Preferably, workpiece 101 can be fully processed without being removed from the apparatus 100. In certain embodiments, the duration from starting substrate to substantially finished product is less than one week, more preferably less than two days, or even more preferably less than one day, or more preferably yet in less than one hour.

In an example embodiment, two process chambers 108 are dedicated to nucleation and oxidation deposition, a third process chamber 108 is dedicated to rapid thermal annealing, and a fourth process chamber 108 is dedicated to chemically-assisted digital beam etching (CADBE). Although one process chamber 108 may be adapted to perform all such processes, dedication allows, for example, the use robust materials to avoid corrosion in the CADBE chamber.

Automated processing software can be used to monitor and analyze all aspects of the system's performance, to perform automation control of all functional operations, and to optimize each process performed by the system. The software can perform a data gathering routine on all sensors of the system and organize the results into operational and performance related reports addressing the status of the system. The software can also prepare a processing report for each workpiece processed through the system including the targeted process compared to the actual process, which can be used to determine fault analysis and process boundaries. Feedback of the process parameters into an automated control loop (e.g., a knowledge based routine) allows high leverage in developing processes. The software may incorporate data gathered from one or more metrology processes to enhance such process development, for example to monitor and adjust etching rates, deposition thicknesses, and contamination. The software can preferably operate all system functions, including process sequences, process parameters for each sequence, etc., although pattern exposure may be controlled by a pattern generation system. The software can produce interlocks based on the process sequences and can provide full automation and optimization of the processes. Other configurations are possible. User control and adjustment is also used in certain embodiments.

Etching is a process for the manufacture of semiconductor circuits. High leverage microelectronic integrated circuits generally utilize high resolution etching of materials to within a critical dimension and location. The ability to etch metals, semiconductors, and dielectrics with precise control over feature depth, uniformity, anisotropy, and reproducibility is desirable for many applications. Standard processing techniques typically utilize a resist-related patterning step followed by a wet or dry chemical etch to perform material removal.

Resist patterning limits the quality of the etch process profile, size, depth, and uniformity. Milling, or etching after exposure by a focused ion beam, provides high resolution removal of material without the use of resist. However, high 'dose and low sensitivity cause slow speed of the equipment, and milling has not been commercially successful. Chemically assisted processes (e.g., chemically assisted ion beam etching (CAIBE) and reactive ion etching (RIE)) were introduced to enhance milling, but they could not be incorporated into FIB equipment because the gas reacted with several components within the exposure chamber. In contrast, as described herein, low dose procedures in combination with concentrated charged particles in groups compatible with resistless processing provides quality patterns and high throughput.

In certain embodiments, etch, implant, and deposition of the workpiece can be performed within the exposure chamber 102. Multiple activation by exposure to a digital beam and a process gas can dramatically improve the efficiency of all three processes. A digital beam specifically designed for a particular process in terms of energy, species, and current, which is possible because the digital beam parameters are adjustable, can impact and decompose a portion of the process gas molecules. The decomposed molecules strike surface atoms of the workpiece to sputter or implant new atoms into the workpiece, or to deposit new atoms on the workpiece surface. In some embodiments, portions and/or all of the workpiece is heated during exposing.

A new family of etching techniques is ideally suitable for high resolution, high throughput microelectronics manufacturing using a resistless process. This new process family is called digital beam assisted chemical etching (DBACE), and is up to 10 to 1.00 times more sensitive to ion exposure than milling. The process comprises at least two steps including digital beam exposure of a pattern to the regions to be etched. The target surface of a workpiece is exposed to very low dose ion energy, creating a reactive region for the chemical agent. The workpiece is then introduced to reactive gas within a separate chamber. As a result, a high resolution dry chemical etching process actively removes the material within the desired location as a parallel process to digital beam pattern exposure on other workpieces within the exposure chamber. As an example, DBACE can be performed on silicon and silicon dioxide ($SiO_2$) with chlorine ($Cl_2$) or fluorine (F2) gas, on gallium arsenide (GaAs) with $Cl_2$, on carbon (e.g., diamond) with oxygen (e.g., $O_2$) and nitrous oxide ($N_2O_3$), on tungsten and molybdenum with carbon bromine trifluoride ($CBrF_3$) and high temperature superconductors (e.g., cuprates such as $La_{1.85}Ba_{0.15}CuO_4$, $YBa_2Cu_3O_{7-x}$ (yttrium barium copper oxide, YBCO, Y123, yttrium barium cuprate), and cuprate-perovskite ceramics with or without nonnal metallic regions) with wet hydroxide chemicals (e.g., sodium hydroxide (NaOH), potassium hydroxide (KOH)). DBACE has been successfully applied to etch the gate recesses of gallium arsenide field effect transistor (FET) devices without destroying the underlying active device region.

The above description is, of optional environments of use for embodiments of methods for operating charged particle beam bunchers.

In certain embodiments, a charged particle beam buncher (e.g. spatial charged particle beam buncher, beam buncher, buncher, etc.) includes a drift tube having a central axis, along which a plurality of ring electrodes is provided. The plurality of ring electrodes provides a time shifted potential gradient synchronized to the particle beam travel. The electric field potential is driven by a bank of RF voltage sources. In certain embodiments, one RF voltage source is coupled to each individual ring electrode within the plurality of ring electrodes, and wherein two such RF voltage sources generate a time varying RF electric field within the integral region between two adjacent ring electrodes. The oscillating RF electric field influences motion of the particle along the trajectory path within the drift tube so that the particles remain bunched, funneled and filtered at the exit point of the buncher assembly until hitting a desired target.

Figure 10:
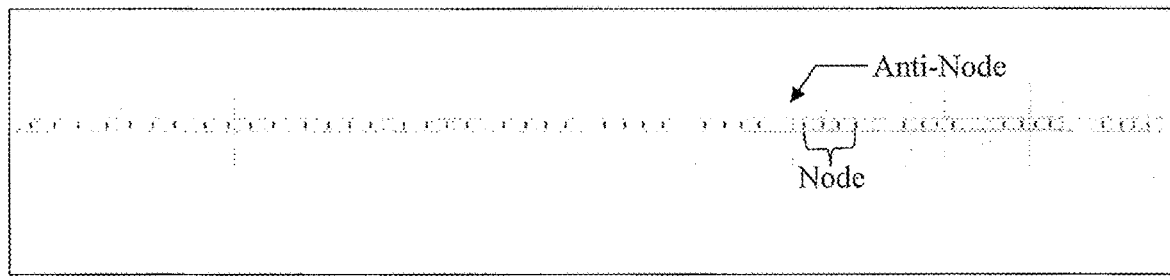
FIG. 10 schematically illustrates a quasi-electrostatic simulation showing the formation of a steady stream of bunched charged particles from a continuous charged particle beam with a well defined node and anti-node period.

Certain embodiments include a beam buncher that incrementally alters the acceleration, velocity, and position of charged particles traveling within a DC (direct current) beam as they pass through a multiple number of ring electrodes. The result of the beam buncher is to provide a higher density distribution of charged particles with spatially resolved nodes (e.g. relatively high charged particle density) and antinodes (e.g. relatively low charged particle density) from the buncher exit to target. The beam buncher can also provide mass selection and a laterally resolved beam profile. In certain embodiments, the nodes have a higher particle density than the antinodes. In certain embodiments, the antinodes have substantially zero charged particle density or zero charged particle density. FIG. 10 schematically illustrates a charged particle beam formed into nodes and antinodes. In certain embodiments, the nodes and antinodes are substantially uniformly spatially resolved. The resulting beam is then bunched at high frequency with resolved spatial distribution thus allowing improved current per beam bunch in conjunction with a high frequency of bunches per unit time. In certain embodiments, application of the beam buncher is to perform digital beam processing of semiconductor materials, machining of materials, digital media disks, communications, biomedical research and alterations, process and development, ion thrusters, spacecraft propulsion and attitude control, beam weapons applications and surveillance applications. Targets can include a detector, wafer, media disk, tissue sample, military target, freespace, atmosphere, machined component, etc.

Temporal bunchers operate to collect charged particles, which are spatially dispersed along one or more axes and bring them closer together later in time at a specific drift distance. However, beyond this time focus, without additional means being applied to a group of like charge particles to keep them confined, the space charge interactions may generate sufficient Coulomb repulsion forces to cause the charged particles in the bunch to once again disperse. Applications of temporal charged particle bunchers include time of flight mass spectrometers and microwave power amplifiers.

A typical temporal buncher includes two spaced apart parallel flat plate electrodes. The two flat plate electrodes create an electric field that is substantially uniform between the plates. Each electrode includes an aperture through the plate thickness which charged particles may pass. The aperture can be near the center of the electrode. In use, a group of charged particles drift along an axis extending between the electrodes through the aperture in each electrode. Each electrode is initially held at a first potential. The value of the electrical potential of one of the electrodes can then be rapidly adjusted by means of a high-speed switch. This generates an electric field between the plates. The electric field can be used to speed up or slow down charged particles moving between the plates relative to the DC beam velocity (e.g. "velocity modulation") causing charged particle to bunch.

The RF potential of a temporal buncher can be changed in less time than the time for the charged particles to travel between the electrodes. By changing the RF potential in less time than the time for the charged particles to travel between electrodes, this effectively provides each charged particle, during the bunching period, with slightly different integrated acceleration profiles depending upon when the charged particle enters the excitation gap and the initial phase of the RF field. Consequently, when a group of such charged particles bunch together, the AC (e.g. alternating current) velocity spectrum of the group due to the RF modulation may contain components related to the fundamental bunching frequency as well as higher order harmonics. As a result, the charged particles in the group may exhibit oscillations in their position back and forth relative to the center mass of each bunch as the bunch travels. If the space charge forces are not ignored, the cavity location of the maximum RF beam current is not a function of signal level, gap width, or the frequency spectrum of operation. The oscillations created by a temporal buncher reduce the ability to control individual charged particles.

For applications like digital beam semiconductor processing, biomedical radiation therapy, spacecraft ion thrusters and attitude control systems, advanced material machining methods, telecommunications, defense related critical technologies, etc., a steady stream of uniform spatially distributed charged particle pulses would be beneficial at bunching modulation frequencies≥50 MHz so that the pulses of charged particles can be deflected or manipulated in some controlled fashion downstream of the charged particle buncher and become bunched using lower energies for more efficient operation.

In certain embodiments, the time varying electric field between adjacent electrodes is quasi-electrostatic, so that each of the charged particles in a group traveling through the buncher experiences a relatively constant phase simulating a traveling wave propagating through the buncher at a phase velocity equal to the mean DC beam velocity. In certain embodiments, each charged particle in a group experiences a different phase of the electric field depending upon the time of arrival of the charged particle into the spatial buncher. Moreover, each particle traveling through the spatial buncher experiences either a corresponding phase of the applied electric field or the opposite polarity electric field at 180° difference in phase. In certain embodiments, the charged particles experiences one phase traveling through the first half of the spatial buncher and 180° difference, in phase traveling through the second half of the spatial buncher.

Certain embodiments provide a steady and/or segmented stream of spatially uniform bunches from the exit of an apparatus until the beam hits a desired target. Certain embodiments include the ability to manipulate and control the combination of multiple gaps per each related beam wavelength by allowing every charged particle to be displaced by its own unique fixed phase of a traveling electric field. The field can be reversed in partial segmentation or full segmentation throughout travel allowing equivalent or close to equivalent adiabatic energy input. For example, the first half of the series of electrodes can be at an opposite voltage as the second half so that energy put into the charged particles by the first half is removed by the second half. In certain embodiments, the application is applied to moderate to high energy particle beams ranging between 500 keV to 500 MeV or greater than 500 keV. In certain embodiments, the beam bunch current is below 10 nano-Amp per beam bunch, above 1 nano-Amp per beam bunch, or greater than 10 milliAmp per beam bunch. In certain embodiments, with bunching frequencies are between 1 GHz to 10 THz, greater than 1 GHz or greater than 10 GHz. Advantageously, lower input voltage can be used by utilizing more. electrode plates at lower voltage. In certain embodiments, the deflection of each beam bunch can be performed after exiting the apparatus but prior to target impact.

In certain embodiments, a spatial charged particle buncher includes a series of spaced apart electrodes separated from each other by a distance. Each electrode includes an aperture through the plate thickness which charged particles may pass. The beam buncher may include a stack of plates, rings or wire loop electrodes. In certain embodiments, the aperture is near the center of the electrode. The plates can have a perimeter through which charged panicles may pass. In certain embodiments, each electrode has a single aperture through which charged particles are transmitted in use. In certain embodiments, the aperture is substantially circular.

Figure 16:
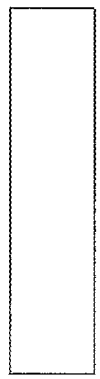
FIG. 16 illustrates different embodiments of the aperture shapes for electrodes including straight wall, taper and bow tie.
Figure 16:
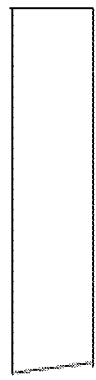
Figure 16:
Figure 16:
Figure 16:
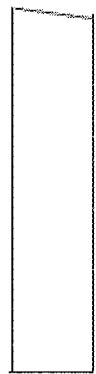
Figure 16:

In certain embodiments, the spatial charged particle buncher includes a first electrode, one or more intermediate electrodes and a last electrode. The intermediate electrodes are between the first electrode and the last electrode. In certain embodiments, the spatial charged particle buncher includes a series of at least 10, 50, 100, 300, 500, 1,000, 3,000, 10,000, 100,000, 1,000,000 or 10,000,000 electrodes. In certain embodiments, the spatial charged particle buncher includes between 100 electrodes, and 10,000 electrodes. In certain embodiments, the electrodes include plates having apertures through which charged particles may pass. In certain embodiments, the electrodes are evenly spaced apart. In certain embodiments, the distance between electrodes is at least 10 times less or at least 20 times less than the distance equal to the DC beam velocity times the bunching period. In certain embodiments, the electrodes are substantially flat and/or circular. The electrodes can also be concave, convex or hyperbolic. In certain embodiments, the surface of the aperture is tapered. For example, the electrode interacting surface within the aperture is tapered. The surface of the aperture can also be straight walled, bow tie, etc., as illustrated in FIG. 16.

Figure 9:
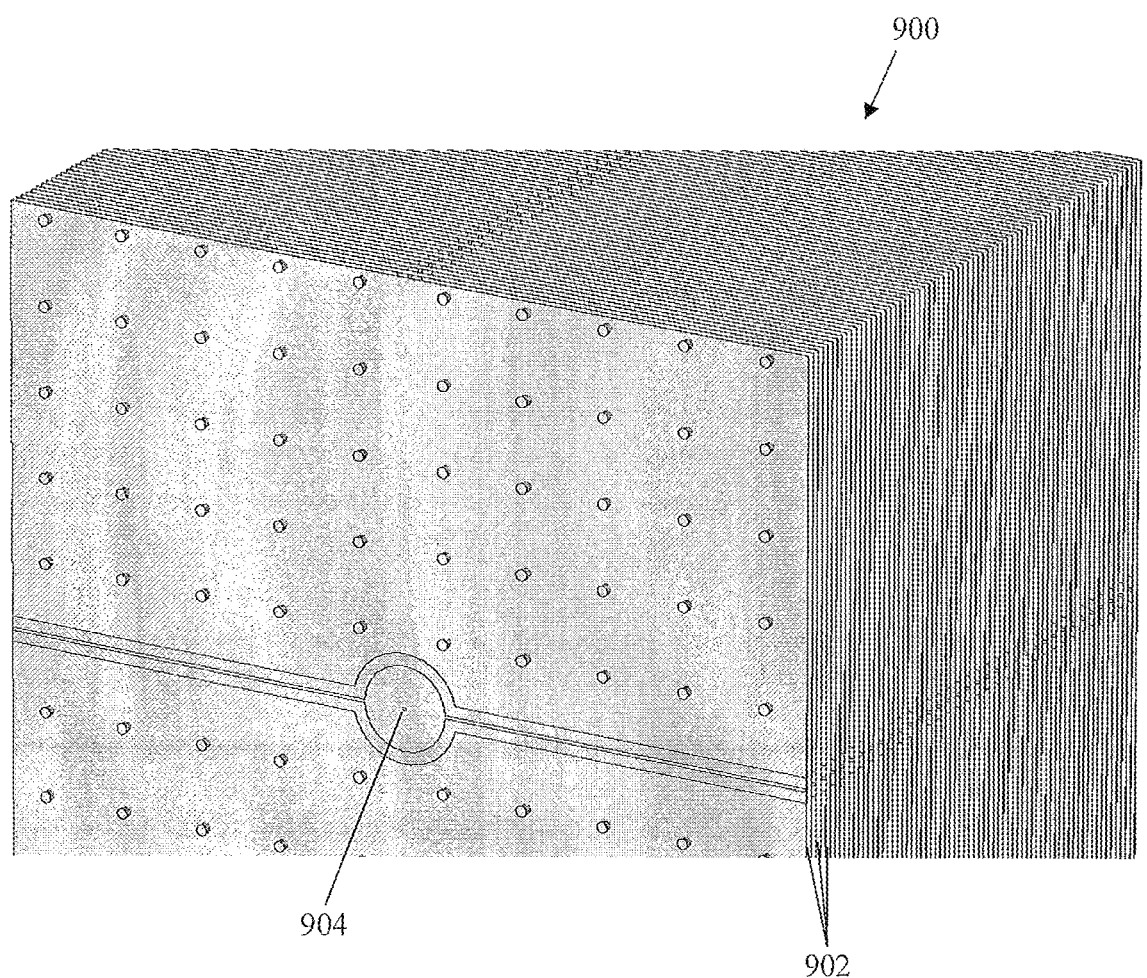
FIG. 9 is a perspective view of an example of a spatial charged particle buncher according to certain embodiments described herein.
Figure 11:
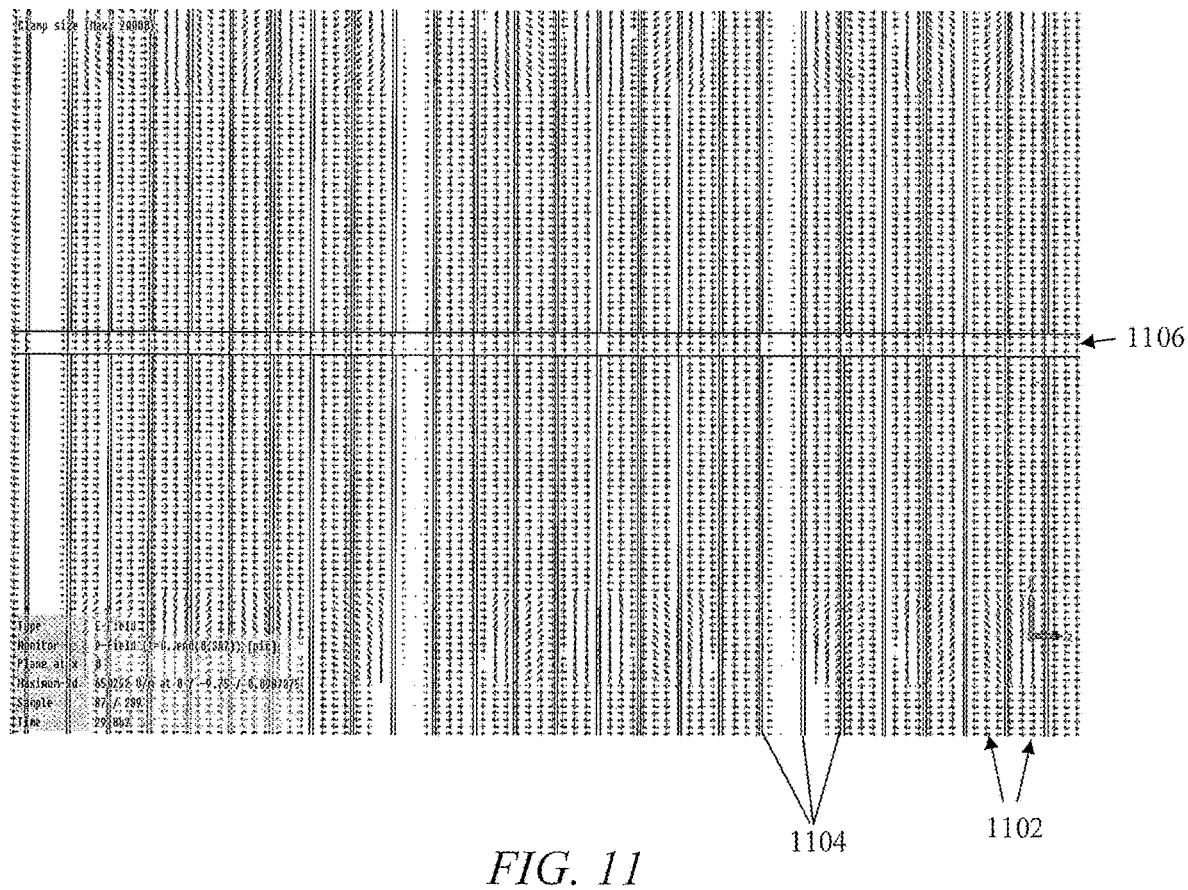
FIG. 11 is a quasi-electrostatic simulation of the electric field distribution through a section of an embodiment of a spatial charged particle buncher.
Figure 12A:
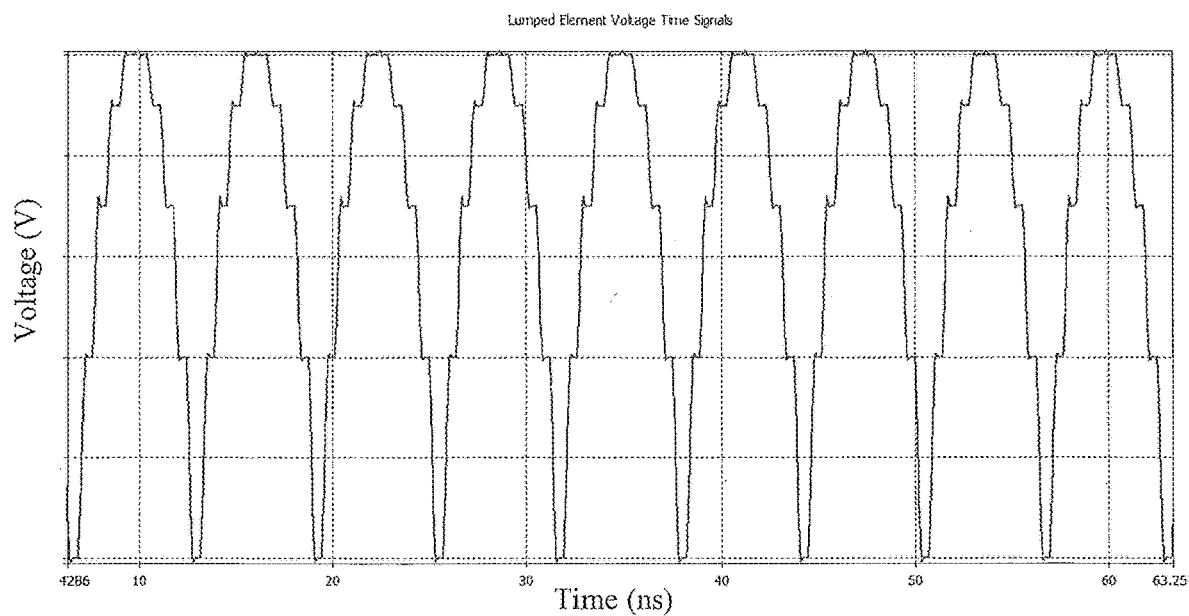
FIG. 12A is a quasi-electrostatic simulation result of the periodic time varying linear piecewise continuous triangular voltage waveform applied to each electrode.
Figure 12B:
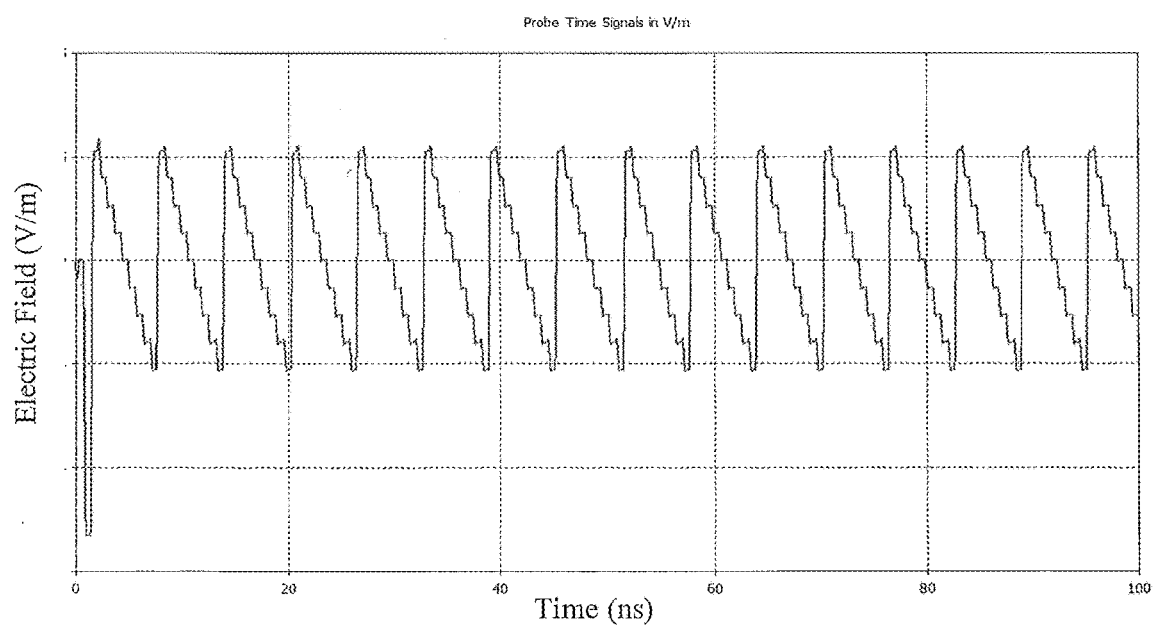
FIG. 12B is a quasi-electrostatic simulation result of the periodic stepped axial electric field in the excitation gap between two adjacent ring electrodes.

FIG. 9 illustrates an example of a spatial charged particle buncher 900 with a plurality of electrodes 902 with apertures 904 according to certain embodiments. FIG. 11 schematically illustrates a quasi-electrostatic simulation of the electric field distribution through a section of an embodiment of a spatial charged particle buncher at a single instance in time. The arrows represent the electric field 102 between the electrodes 1104. Each of the electrodes 1104 has an aperture 1106 through it.

Figure 15:
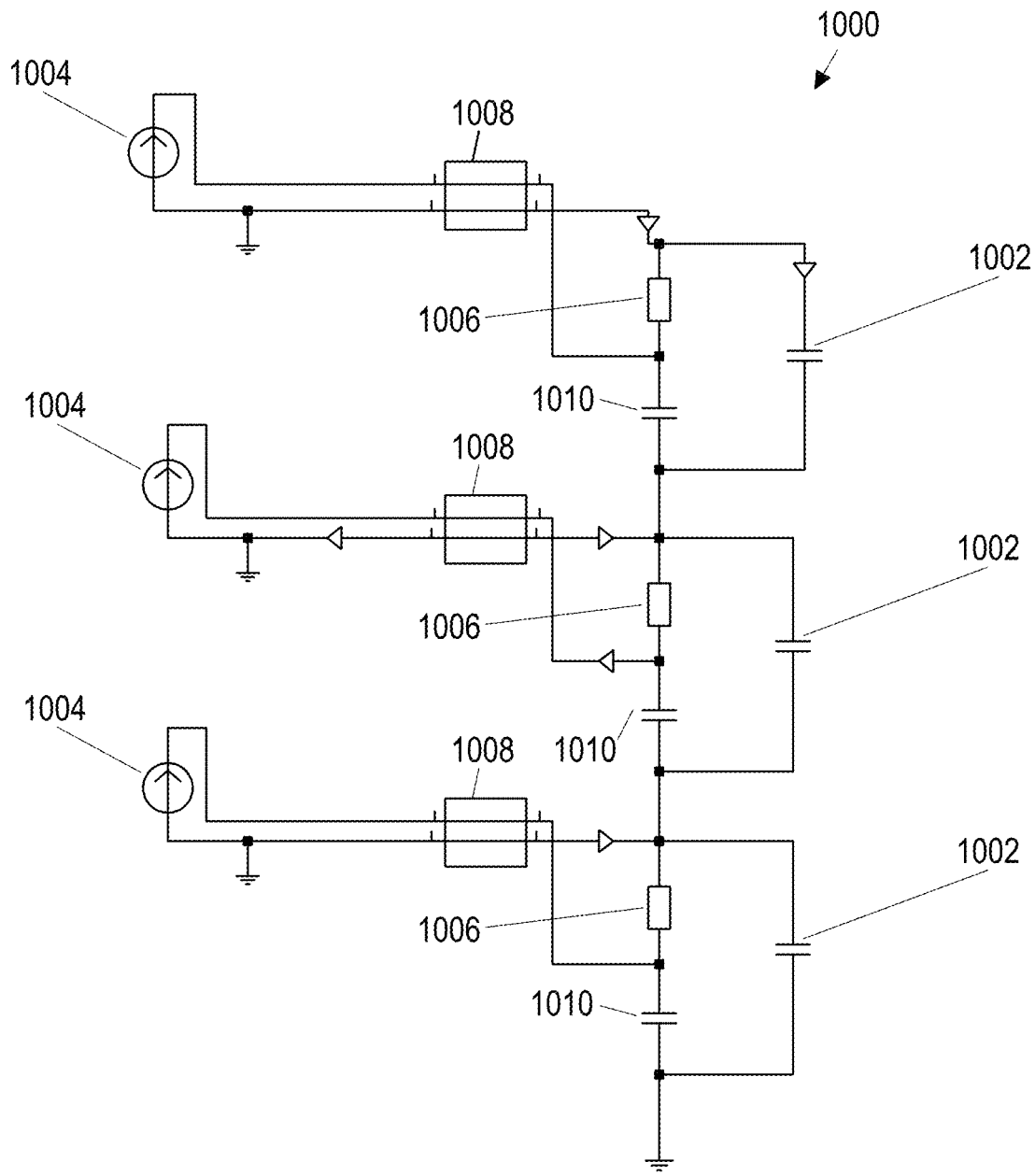
FIG. 15 is an example of an embodiment of a voltage ladder circuit or network that could be connected to each electrode to drive the operation of the spatial buncher.

In certain embodiments, an AC or RF voltage waveform of variable profile, is applied to each electrode using a suitable voltage network, distribution or ladder circuit. An example of an embodiment of a voltage ladder 1000 is schematically illustrated in FIG. 15. The voltage ladder) 000 includes voltage sources 1004, transmission lines 1008, three groups of two electrodes 1002, and a capacitor 1010 and a resistor 1006 between each set of two electrodes 1002.

In certain embodiments, an RF impulse generator producing a periodic sequence of variable amplitude and variable shape voltage pulses are applied to each electrode. In certain embodiments, in operation, the periodic pulses (e.g. periodic pulse train) or triangular voltage waveform of a series of voltage steps is applied to each electrode in the buncher. The voltage waveform can be a series of periodic linear piecewise continuous voltage steps, or a series of variable amplitude and variable shape voltage pulses. The initial on time of the start of the periodic voltage waveform can be temporally delayed from electrode to electrode. In certain embodiments, the time delay between when the voltage waveform is applied to each electrode in sequence is (i) by a time interval equal to the charged particle transit time between adjacent electrodes, (ii) by a harmonic of the time interval equal to the charged particle transit time between adjacent electrodes, (iii) by a halftone of the time interval equal to the charged particle transit time between adjacent electrodes, and/or (iv) by a time less than or equal to the inverse of the bunching frequency. In certain embodiments, the frequency of the periodic applied electrode voltage waveform is (i) equal to the bunch frequency, (ii) a harmonic of the bunch frequency, or (3) a mixed-mode signal of the bunch frequency.

In certain embodiments, the electric field is shaped such that charged particles traveling through the buncher and having the same mass to charge ratio are all brought substantially into time focus at the target plane downstream of the buncher. In certain embodiments, the electric field causes spatial alignment of charged particles such that the mass of charged particles is filtered by positional displacement. In certain embodiments, the profile of the electric field is a sawtooth triangular profile.

In certain embodiments, the voltage range applied to each adjacent electrode is increased or decreased in steps. In certain embodiments, the steps are substantially constant. In certain embodiments, the about first half of the series of electrodes of the spatial charge buncher can be increased in steps of about 0.001 to 1000 volts, about 1 volt, about 5 volts, or about 10 volts. In certain embodiments, the voltages applied to the about latter half of the spatial charge buncher are decreased in steps of about 0.001 to 1000 volts, about 1 volt, about 5 volts, or about 10 volts. In certain embodiments, the number of discrete periodic voltage steps or voltage pulses applied to each electrode is (i) greater than or equal to 3 discrete components, (ii) greater than or equal to 5 discrete components, (iii) greater than of equal to 7 discrete components, (iv) greater than or equal to 9 discrete components, (v) greater than or equal to 10 discrete components, or (vi) greater than or equal to 20 discrete components.

In certain embodiments, the first and last electrodes of the series of electrodes are connected to ground to act as field termination plates for the buncher device. For example, the first and last electrodes can be connected to means for transferring charge onto or off the electrode. In certain embodiments, the time varying electric field between each adjacent pair of electrodes is tuned to be matched to the time varying electric field between any other two adjacent plates except for being displaced in phase.

Figure 13:
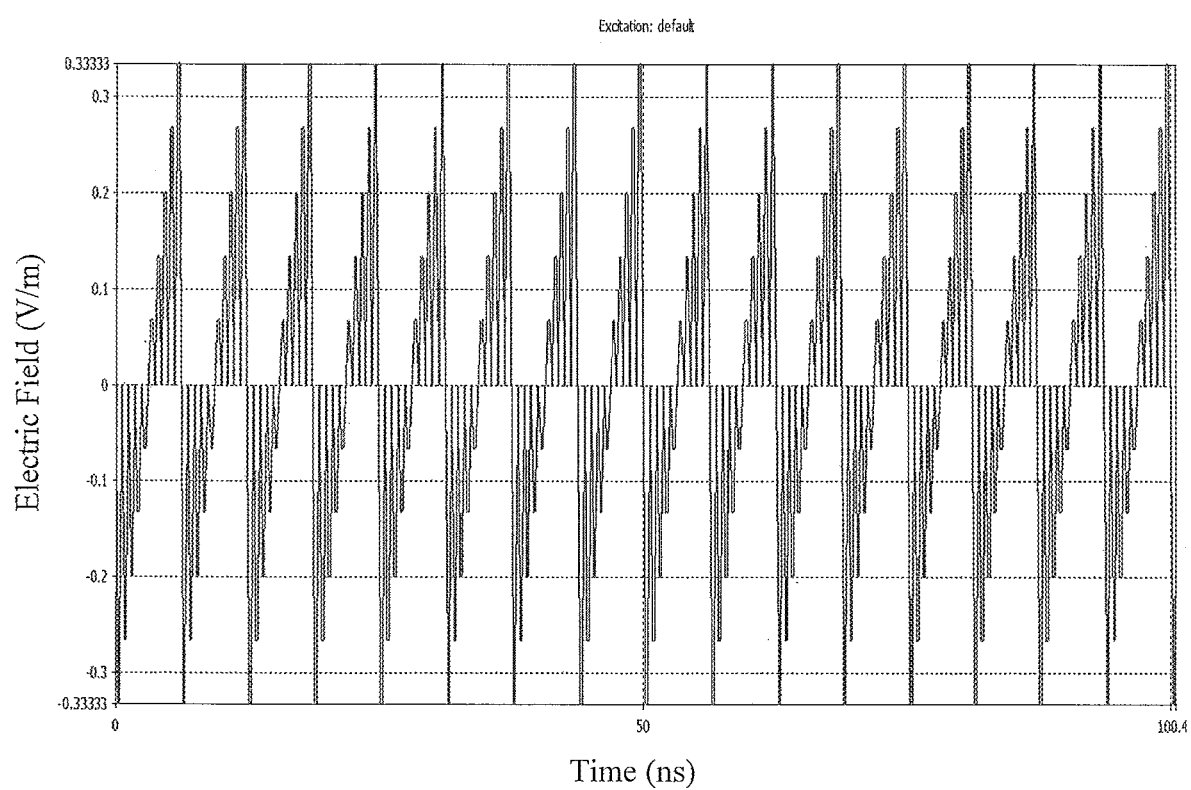
FIG. 13 is a quasi-electrostatic simulation result of the periodic axial variable amplitude electric field pulse train produced in the excitation gap between two adjacent electrodes formed by applying a periodic train of variable amplitude voltage pulses to each electrode with the voltage signals delayed between two adjacent electrodes by a delay equal to the charged particle transit time through the region defined between two adjacent electrodes.
Figure 14:
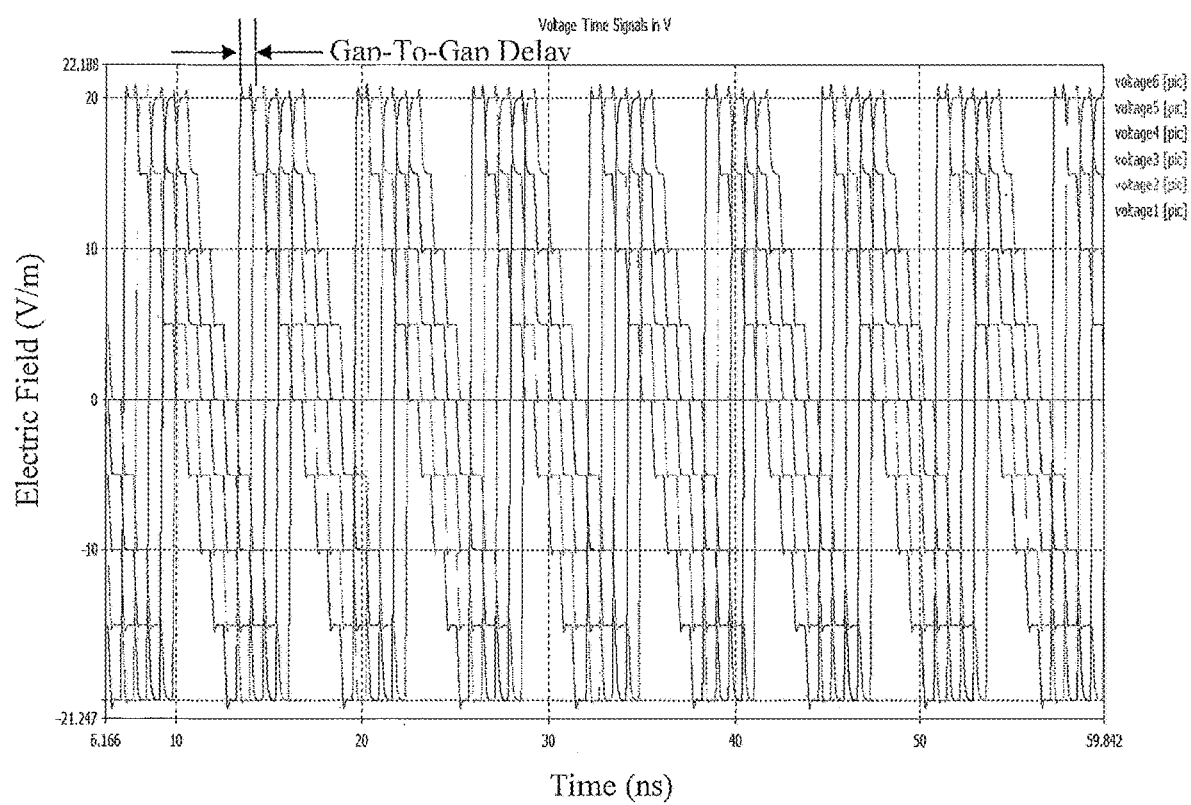
FIG. 14 is a quasi-electrostatic simulation result of the periodic stepped axial electric field synchronized with the charged particle beam travel so that every charged particle experiences a constant phase of the periodic stepped axial electric field as it propagates down the axis of the device from excitation gap-to-excitation gap.

FIG. 13 illustrates a quasi-electrostatic simulation result of the periodic axial variable amplitude electric field pulse train produced in the excitation gap between two adjacent electrodes formed by applying a periodic train of variable amplitude voltage pulses to each electrode with the voltage signals delayed between two adjacent electrodes by a delay equal to the charged particle transit time through the region defined between two adjacent electrodes. FIG. 14 illustrates a quasi-electrostatic simulation result of the periodic stepped axial electric field synchronized with the charged particle beam travel so that every charged particle experiences a constant phase of the periodic stepped axial electric field as it propagates down the axis of the device from excitation gap-to-excitation gap. Each of the five plots represents the voltage as a function of time for a series of five electrodes.

In certain embodiments, the time varying electric field, driven at the bunching modulation frequency, is generated between two successive electrodes in the spatial buncher. In certain embodiments, the bunching modulation frequency and or the node repetition rate is above 1 MHz, above 10 MHz, above 50 MHz, above 100 MHz, above 250 MHz, above 1 GHz, above 10 GHz, or above 100 GHz. In certain embodiments, the bunching modulation frequency is below 100 GHz. The first, intermediate and last electrodes can be connected in series alternately with capacitors, network, an active circuit and/or an active component. In certain embodiments, the electrodes are connected in series with resistors. The capacitors may be connected in parallel with resistors chosen to allow a proportionally small conduction current to flow between the electrodes to allow any free charges to drain from the plates, and may not substantially affecting performance of the buncher. The shape of the time varying electric field generated can be varied. For example, the shape can be varied by the capacitance between each pair of adjacent electrodes.

The shaped of the electric field can be generally approximated by Maxwell's displacement field with free conduction currents being transferred on to or away from the first, intermediate, and last electrodes. The speed with which the shaped displacement field can be generated and/or adjusted can be generated and/or adjusted by the magnitude of the current flowing to or from the first, intermediate, and last electrodes. Electronic switches using field effect transistors can sustain high switching currents of in excess of 100 Amperes making it possible to apply a potential of a few volts in less than a nanosecond.

In certain embodiments, the magnitude of displacement current flowing onto or away from the intermediate electrodes exceeds any conduction current flowing onto or off the intermediate electrodes by at least two orders of magnitude, more preferably at least three orders of magnitude.

In certain embodiments, the DC beam current is less than 100 nano-Amps per bunch, less than 500 nanoAmps per bunch, less than 1 milli-Amps per bunch, less than 100 milli-Amps per bunch, less than 1 Amps per bunch or less than 100 Amps per bunch. In certain embodiments, the DC beam current is greater than 10 nano-Amps per bunch or greater than 100 nano-Amps per bunch.

According to certain embodiments, the transit time of charged particles between two electrodes is less than or equal to 200 ns, less than or equal to 10 ns, less than or equal to 5 ns, less than or equal to 50 ps, or less than or equal to 0.1 ps.

In certain embodiments, the spatial buncher is maintained at a pressure of greater than or equal to 0.000001 mbar, greater than or equal to 0.00005 mbar, greater than o~ equal to 0.0001 mbar, greater than or equal to 0.005 mbar, greater than or equal to 0.01 mbar, greater than or equal to 0.05 mbar, greater than or equal to 0.1 mbar, greater than or equal to 0.5 mbar, greater than or equal to 1 mbar, greater than or equal to 5 mbar, or greater than or equal to 10 mbar. In certain embodiments, the spatial buncher is maintained at a pressure of less than or equal to 10 mbar, less than or equal to 5 mbar, less than or equal to 1 mbar, less than or equal to 0.5 mbar, less than or equal to 0.1 mbar, less than or equal to 0.05 mbar, less than or equal to 0.01 mbar, less than or equal to 0.005 mbar, less than or equal to 0.001 mbar, less than or equal to 0.0005 mbar, or less than or equal to 0.0001 mbar. In certain embodiments, the spatial buncher is maintained at a pressure of between 0.0001 and 10 mbar, between 0.0001 and 1 mbar, between 0.0001 and 0.1 mbar, between 0.0001 and 0.01 mbar, between 0.0001 and 0.001 mbar, between 0.001 and 10 mbar, between 0.001 and 1 mbar, between 0.001 and 0.1 mbar, between 0.001 and 0.01 mbar, between 0.01 and 10 mbar, between 0.01 and 1 mbar, between 0.01 and 0.1 mbar, between 0.1 and 10 mbar, between 0.1 and 1 mbar, or between 1 and 10 mbar.

In certain embodiments, the spatial buncher includes an charged particle funnel that includes a plurality of electrodes having apertures that become progressively smaller or larger as charged particles pass through the apertures. In certain embodiments, the plurality of electrodes are a series of electrodes and the apertures become progressively smaller or larger through the series. The spatial buncher configured as an charged particle funnel may have different voltage schemes, such as DC, AC, RF, or a combination thereof, applied to each of the electrode. The charged particle funnel may include a stack of plate, ring, or wire loop electrodes.

In certain embodiments, the diameter of the apertures of at least 50%, 60%, 70%, 80%, 90% or 95% of the electrodes forming the spatial buncher is less than or equal to 2 mm, less than or equal to 1 mm, less than or equal to 0.5 mm, less than or equal to 0.2 mm, or less than or equal to 0.1 mm. In certain embodiments, at least 50%, 60%, 70%, 80%, 90% or 95% of the electrodes forming the spatial buncher have apertures with substantially the same size and/or area. In certain embodiments, the thickness of at least 50%, 60%, 70%, 80%, 90% or 95% of the electrodes is less than or equal to 3 mm, less than or equal to 2.0 mm, less than or equal to 1.0 mm, less than or equal to 0.5 mm, less than or equal to 0.1 mm, or less than or equal to 0.01 mm.

In certain embodiments, the spatial charged particle buncher has a length of less than 5 cm, 5-10 cm, 10-15 cm, or greater than 15 cm. In certain embodiments, at least 10%, 20%, 30%, 40%, 50%, 60%, 70%, 80%, 90%, or 95% of the electrodes are connected to a AC and/or RF voltage supply in combination with a DC voltage source.

In certain embodiments, axially adjacent electrodes are supplied with AC and/or RF voltages that are in exact or similar phase with each other. Transmission delay lines tuned to the transit time of charged particles traveling between two adjacent electrodes can be used to insure that each particle experiences a constant phase of the time varying electric field as it travels through the first half of the spatial buncher and the inverse polarity with 180 degree phase difference while traveling through the second half of the spatial buncher. In certain embodiments, the charged particles traveling through the spatial buncher experiences several such control segments of alternating electric field phase. In certain embodiments, each charged particle traveling through the spatial buncher experiences at least 2 such cycles, at least 5 such cycles, or at least a thousand such cycles. In certain embodiments, each cycle is balanced in polarity such that the beam experiences the same or almost similar number of positive and negative electric fields.

A repeating pattern of electrical DC potentials may also be superimposed along the length of the spatial buncher so that a DC periodic waveform is formed to provide additional operational capability as a charged particle guide. The DC potential waveform can be arranged to travel along the charged particle guide in the direction and at a velocity at which it is desired to move charged particles along the spatial buncher. The charged particle guide may also be configured to act as a charged particle funnel wherein adjacent ring electrodes have successively smaller apertures with increasing radial electrostatic field density to squeeze down the radial extent of the charged particle bunches and improve the resolution for digital beam processing. In certain embodiments, the radial shaped electric field is generated substantially such that, in use, the electric field causes the position of charged particles to be displaced radially to the direction of propagation while creating an axial time varying electric field that causes a steady or segmented substantially uniform spatial distribution of charged particles that form nodes of relatively high particle density and antipodes of relatively low particle density.

In certain embodiments, the spatial buncher may include an AC or RF charged particle guide such as a multiple rod set or stacked ring set, which is segmented in the axial direction so that independent transient DC potentials may be applied to each segment. The transient DC potentials can be superimposed on top of the RF confining voltage and any constant DC offset voltage. The DC potentials can be changed temporally to generate a travelling DC potential wave in the axial direction.

At any instant in time, a voltage gradient can be generated between segments that act to adiabatically push or pull charged particles longitudinally either in the forward or backward direction related to the interacting field. As the DC voltage gradient moves in the same direction as the beam trajectory, the field applied to the charged particles forces displacement. The individual DC voltages on each of the segments may be programmed to create a specific waveform. Furthermore, the individual DC voltages on each of the segments may be programmed to change in synchronism so that the DC potential waveform is maintained but shifted in the direction to displace the charged particles forward or backward along the path of travel.

The DC. potential waveform may be superimposed on any nominally imposed constant axial DC voltage offset. In certain embodiments, a non-constant axial DC voltage gradient can be used. The travelling DC wave may be provided in conjunction with an axial DG voltage gradient.

The transient DC voltage applied to each segment may be above or below that of a constant DC voltage offset applied to the electrodes forming the charged particle guide. The transient DC voltage causes the charged particles to move in the axial direction. The transient DC voltages applied to each segment may be programmed to change continuously or in a series of steps. The sequence of voltages applied to each segment may repeat at regular intervals or at intervals that may progressively increase or decrease.

After the beam has passed through the series of electrodes, the charged particle beam can pass through a means for deflecting charged particles. For example, the charged particle beam can pass through one or more deflection electrodes, one or more magnetic lenses, one or more reflective optics, one or more focusing optics, etc. The charged particles can exit in a substantially continuous or pseudo-continuous manner.

A charged particle source can precede the series of electrodes. Charged particle sources can include ion sources, pulsed ion sources, positively charged ions, negatively charged ions, singly charged ions, doubly charged ions, multiple charged ions, positrons, electrons, carbon nanotubes, liquid metal ion sources, plasma ion sources, volume plasma ion sources, gas field ionization sources, carbon nanotube field emitters, free electron lasers, pulsed ablation ion sources, magnetically confined plasma anode sources, thermal field emission electron sources, sources adapted to generate a plurality of charged particle species, etc.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A charged particle buncher comprising:
a series of spaced apart electrodes arranged to generate a shaped electric field, the series comprising a first electrode, a last electrode and one or more intermediate electrodes; and
a waveform device attached to the electrodes and configured to apply a periodic potential waveform to each electrode independently in a manner so as to form a quasi-electrostatic time varying potential gradient between adjacent electrodes and to cause spatial distribution of charged particles that form a plurality of first regions having a charged particle density and a plurality of second regions having substantially no charged particle density.

2. The charged particle buncher of claim 1, wherein the series of spaced apart electrodes comprises five or more electrodes.

3. The charged particle buncher of claim 1, wherein a distance between the electrodes of the series of spaced apart electrodes is at least 10 times less than a distance equal to a DC beam velocity of the charged particles multiplied by a bunching period of the charged particles.

4. The charged particle buncher of claim 1, wherein the periodic potential waveform comprises an AC or RF voltage waveform of variable profile.

5. The charged particle buncher of claim 1, wherein a voltage applied to each sequential electrode of the series of spaced apart electrodes is delayed between two adjacent electrodes by a delay equal to a multiple of a charged particle transition time.

6. The charged particle buncher of claim 1, wherein each particle traveling through the charged particle buncher experiences a first phase electric field on the series of spaced apart electrodes while traveling through a first half of the charged particle buncher and a second phase electric field on the series of spaced apart electrodes while traveling through a second half of the charged particle buncher.

7. The charged particle buncher of claim 1, wherein the spatial distribution of charged particles has a distributed energy distribution.

8. The charged particle buncher of claim 1, wherein the first regions each comprise greater than 100 charged particles per first region.

9. The charged particle buncher of claim 1, wherein the spatial distribution of charged particles has a longitudinal spacing distance (D) between the first regions of less than 100 meters of beam travel.

10. The charged particle buncher of claim 1, wherein the series of spaced apart electrodes are configured to longitudinally compress the spatial distribution of charged particles into groups while the charged particles travel to a workpiece.

11. The charged particle buncher of claim 1, wherein the first regions each have a beam bunch current above 0.01 amps.

12. The charged particle buncher of claim 1, further comprising a continuous particle source configured to generate the charged particles.

13. The charged particle buncher of claim 12, further comprising electrodes configured to apply a pulsed incident neutralizing beam to the charged particle source.

14. The charged particle buncher of claim 12, further comprising electrodes configured to modulate an on/off state of the charged particle source.

15. The charged particle buncher of claim 1, wherein the electrodes of the series of spaced apart electrodes have apertures that are equal in size.

16. The charged particle buncher of claim 1, wherein the periodic potential waveform applied to the first, intermediate and last electrodes is comprised of a series of variable amplitude and variable shape voltage pulses.

17. The charged particle buncher of claim 1, wherein the periodic potential waveform applied to each electrode is delayed by a time interval equal to a charged particle transit time of a beam of charged particles traversing a gap between adjacent electrodes.

18. The charged particle buncher of claim 1, wherein the periodic potential waveform applied to each electrode is delayed by a time interval equal to a fractional harmonic of a charged particle transit time of a beam of charged particles traversing a gap between adjacent electrodes.

19. The charged particle buncher of claim 1, wherein the periodic potential waveform has a frequency substantially equal to a bunch frequency of the charged particles.

20. The charged particle buncher of claim 1, wherein the periodic potential waveform has a frequency substantially equal to a harmonic of a bunch frequency of the charged particles.

21. The charged particle buncher of claim 1, wherein the charged particle buncher is configured to apply a frequency of an applied voltage waveform that is a mixed mode signal of a bunch frequency.

22. The charged particle buncher of claim 1, wherein a node repetition rate is greater than 100 GHz.

23. The charged particle buncher of claim 1, wherein the series comprises at least one hundred electrodes.

24. The charged particle buncher of claim 1, wherein the series comprises at least five hundred electrodes.

25. The charged particle buncher of claim 1, wherein the series comprises at least a thousand electrodes.

26. The charged particle buncher of claim 1, wherein the charged particles have a beam current less than or equal to 10 milli-Amps per bunch.

27. The charged particle buncher of claim 1, wherein the electrodes comprise plates having apertures through which the charged particles pass.

28. The charged particle buncher of claim 1, wherein the electrodes are concave.

29. The charged particle buncher of claim 1, wherein the electrodes are convex.

30. The charged particle buncher of claim 1, wherein the electrodes are hyperbolic.

31. The charged particle buncher of claim 1, wherein each of the electrodes has an aperture and a tapered interacting surface within the aperture.

32. The charged particle buncher of claim 1, wherein the first, intermediate and last electrodes are connected in series with capacitors.

33. The charged particle buncher of claim 1, wherein the first, intermediate and last electrodes are connected in series with an active circuit.

34. The charged particle buncher of claim 1, further comprising an ion source and a detector, wherein the series of electrodes is preceded by the ion source and/or followed by the detector.

35. The charged particle buncher of claim 1, further comprising an ion source, wherein the series of electrodes is preceded by an ion source and/or is configured to be followed by machined materials.

36. The charged particle buncher of claim 1, further comprising an ion source, wherein the series of electrodes is preceded by the ion source and/or is configured to be followed by a freespace.

37. The charged particle buncher of claim 1, further comprising an ion source, wherein the series of electrodes is preceded by the ion source and/or is configured to be followed by printed medicine.

38. The charged particle buncher of claim 1, further comprising an ion source, wherein the series of electrodes is preceded by the ion source and/or is configured to be followed by a machined component.

39. The charged particle buncher of claim 1, further comprising an ion source and one or more deflection electrodes, wherein the series of electrodes is preceded by the ion source and/or followed by the one or more deflection electrodes.

40. The charged particle buncher of claim 1, further comprising an ion source and/or one or more magnetic lenses, wherein the series of electrodes is preceded by the ion source and/or followed by the one or more magnetic lenses.

41. The charged particle buncher of claim 1, further comprising an ion source and/or reflective optics, wherein the series of electrodes is preceded by the ion source and/or followed by the reflective optics.

42. The charged particle buncher of claim 1, further comprising an ion source and/or focusing optics, wherein the series of electrodes is preceded by an ion source and/or followed by the focusing optics.

43. The charged particle buncher of claim 1, wherein the electrodes are connected in series with resistors.

44. The charged particle buncher of claim 1, further comprising a pulsed ion source.

45. The charged particle buncher of claim 1, further comprising a continuous ion source of positively charged anions.

46. The charged particle buncher of claim 1, further comprising a continuous ion source of negatively charged ions.

47. The charged particle buncher of claim 1, further comprising a continuous particle source of the charged particles, the charged particles comprised of positrons.

48. The charged particle buncher of claim 1, further comprising a continuous particle source of the charged particles, the charged particles comprised of electrons.

49. The charged particle buncher of claim 1, further comprising a continuous particle source of the charged particles, the charged particles comprised of carbon nanotubes.

50. The charged particle buncher of claim 1, further comprising a continuous particle source of the charged particles and comprising a liquid metal ion source.

51. The charged particle buncher of claim 1, further comprising a continuous particle source of the charged particles and comprising a plasma ion source.

52. The charged particle buncher of claim 1, further comprising a continuous particle source of the charged particles and comprising a gas field ionization source.

53. The charged particle buncher of claim 1, further comprising a continuous particle source of the charged particles and comprising a carbon nanotube field emitter.

54. The charged particle buncher of claim 1, further comprising a continuous particle source of the charged particles and comprising a free electron laser.

55. The charged particle buncher of claim 1, further comprising a continuous particle source of the charged particles and comprising a pulsed ablation ion source.

56. The charged particle buncher of claim 1, further comprising a continuous particle source of the charged particles and comprising a magnetically confined plasma anode source.

57. The charged particle buncher of claim 1, further comprising a continuous particle source of the charged particles and comprising a thermal field emission electron source.

58. The charged particle buncher of claim 1, further comprising a continuous particle source of the charged particles and configured to generate a plurality of charged particle species.

59. The charged particle buncher of claim 1, further comprising a pulsed ion source in combination with a means for deflecting ions emitted by the pulsed ion source.

60. The charged particle buncher of claim 1, wherein the charged particles exit the charged particle buncher in a substantially continuous or pseudo-continuous manner.

61. The charged particle buncher of claim 1, further configured to have a buncher repetition rate greater than 1 MHz.

62. The charged particle buncher of claim 1, further configured to have a buncher repetition rate greater than 10 MHz.

63. The charged particle buncher of claim 1, further configured to have a buncher repetition rate greater than 100 MHz.

64. The charged particle buncher of claim 1, further configured to have a buncher repetition rate greater than 1 GHz.

65. The charged particle buncher of claim 1, wherein the periodic potential waveform applied to the first, intermediate and last electrodes is comprised of a series of periodic linear piecewise continuous voltage steps.

66. The charged particle buncher of claim 1, wherein different polarities applied to the electrodes produce a near net negative velocity of the bunched charged particles.

67. The charged particle buncher of claim 1, wherein the electrodes comprise plates having apertures through which the charged particles pass and the electrodes are shaped at a center aperture edge to improve the spatial focus of the charged particles passing the electrodes.

68. The charged particle buncher of claim 1, wherein the electrodes comprise plates having apertures through which the charged particles pass and the electrodes are shaped at a center aperture edge to improve a uniformity of a particle bunch group velocity relative to a mean velocity of the charged particles passing the electrodes.

69. The charged particle buncher of claim 1, wherein the electrodes comprise plates having apertures through which the charged particles pass and each of the electrodes has an interacting surface within the aperture that is tapered at a center aperture edge.

70. The charged particle buncher of claim 1, wherein the first and last electrodes are connected to means for transferring charge on to or off the electrode.

71. The charged particle buncher of claim 1, further comprising at least one deflection stage configured to apply deflection stage pulses to the charged particles.

72. The charged particle buncher of claim 71, wherein the at least one deflection stage comprises one or more radially oriented electrodes configured to generate lateral forces by transverse electric field imparted to interact with each temporal and spatial resolved bunched packet of charged particles.

73. The charged particle buncher of claim 71, wherein the at least one deflection stage comprises one or more radially oriented optical emitters configured to generate lateral forces by radiation pressure imparted to interact with each temporal and spatial resolved bunched packet of charged particles.

74. The charged particle buncher of claim 71, wherein successive deflection stage pulses have amplitudes that are varied to impart a unique controlled amount of lateral deflection to each beam bunch independently within the charged particles.

75. The charged particle buncher of claim 71, wherein a delay time between successive deflection stage pulses is varied to impart a unique controlled amount of lateral deflection to each beam bunch independently within the charged particles.

76. The charged particle buncher of claim 71, wherein the at least one deflection stage comprises an optical emitter or electrode channel oriented in a multipole configuration.

77. The charged particle buncher of claim 71, wherein two adjacent optical deflection stages of the at least one deflection stage have different configurations of optic channels.

78. The charged particle buncher of claim 71, wherein two successive deflection stage pulses have different pulse widths to impart a unique controlled amount of lateral deflection to each beam bunch independently within the charged particles.

79. The charged particle buncher of claim 71, wherein each successive deflection stage pulse has a different fundamental wavelength to impart a unique controlled amount of lateral deflection to each beam bunch independently within the charged particles.

80. The charged particle buncher of claim 71, wherein two opposing deflection stage channels within a single stage emit pulses at slightly different times to impart a unique controlled amount of lateral deflection to each beam bunch independently within the charged particles.

81. The charged particle buncher of claim 71, wherein two opposing deflection stage channels within two adjacent stages emit pulses at slightly different times to impart a unique controlled amount of lateral deflection to each beam bunch independently within the charged particles.

82. The charged particle buncher of claim 71, where the at least one deflection stage includes fiber optics optical emitters.

83. The charged particle buncher of claim 71, where the at least one deflection stage includes lasers.

84. The charged particle buncher of claim 71, where the at least one deflection stage includes electrically conductive electrodes.

85. The charged particle buncher of claim 71, wherein a delay time between successive deflection stage pulses is varied to impart a unique controlled amount of lateral deflection to each beam bunch independently within the charged particles.

86. The charged particle buncher of claim 71, wherein the charged particles are directed to the target to create a pattern.

87. The charged particle buncher of claim 71, wherein the at least one deflector stage induces radiation emission from one or more groups of charged particles by means of simultaneous energetic excitation of more than one group of charged particles using electric discharge.

88. The charged particle buncher of claim 71, wherein the at least one deflector stage induces radiation emission from one or more groups of charged particles by means of simultaneous energetic excitation of more than one group of charged particles using pulsed laser excitation.

89. The charged particle buncher of claim 71, further comprising a reflector coated to reflect at an extended ultraviolet wavelength.

90. The charged particle buncher of claim 89, wherein the reflector has a physical size sufficient to simultaneously capture and reflect the ensemble of pulses of extended ultraviolet wavelength radiation emitted from more than one group of charged particles excited by the deflector.

91. The charged particle buncher of claim 1, wherein the charged particles form a fixed pattern of a plurality of bunched traveling particle beam segments and nonbunched traveling particle beam segments.

92. The charged particle buncher of claim 91, wherein the bunched particle beam segments have a spatially uniform charged particle density and the nonbunched particle beam segments have substantially no charged particle density.

93. The charged particle buncher of claim 1, further comprising a physical conductive device configured to deliver charge to a beam in the electromagnetic spectrum from radio waves to x-ray to apply an electric field.

94. The charged particle buncher of claim 1, further comprising a light emitting device configured to deliver radiation pressure to a beam in the electromagnetic spectrum from radio waves to x-rays.

95. The charged particle buncher of claim 1, wherein the series of electrodes is preceded by an ion source and/or followed by a material classified as a biomolecule organic compound or living organism material or tissue.

96. A charged particle funnel comprising:
a series of spaced apart electrodes arranged to generate a radial shaped electric field, the series comprising a first electrode, a last electrode and one or more intermediate electrodes; and
a buncher control device configured to generate the radial shaped electric field which causes charged particles to be displaced radially to the direction of propagation while creating an axial time varying electric field changing on a timescale equivalent to a mean transit time of a beam of charged particles traversing gaps between adjacent electrodes and causes a steady or segmented uniform spatial distribution of charged particles that form a plurality of first regions having a charged particle density and second regions having substantially no charged particle density.

97. The charged particle funnel of claim 96, wherein the plurality of first regions and second regions are formed from a charged particle beam with an energy greater than 500 keV.

98. The charged particle funnel of claim 96, wherein the series comprises at least ten electrodes.

99. The charged particle funnel of claim 96, wherein the series comprises at least 40 electrodes.

100. The charged particle funnel of claim 96, wherein the series comprises at least one hundred electrodes.

101. The charged particle funnel of claim 96, wherein each of the electrodes comprises a plate having an aperture through which the charged particles pass.

102. The charged particle funnel of claim 96, wherein each of the electrodes comprises a plate having a perimeter through which the charged particles pass.

103. The charged particle funnel of claim 96, wherein the electrodes are substantially flat.

104. The charged particle funnel of claim 96, wherein the electrodes are concave.

105. The charged particle funnel of claim 96, wherein the electrodes are convex.

106. The charged particle funnel of claim 96, wherein the electrodes are hyperbolic.

107. The charged particle funnel of claim 96, wherein each of the electrodes has a tapered electrode interacting surface within an aperture.

108. The charged particle funnel of claim 96, wherein the first and last electrodes are connected to means for transferring charge on to or off the electrode.

109. The charged particle funnel of claim 96, wherein the first, intermediate and last electrodes are connected in series with capacitors.

110. The charged particle funnel of claim 96, wherein the first, intermediate and last electrodes are connected in series with a network.

111. The charged particle funnel of claim 96, wherein the first, intermediate and last electrodes are connected in series with an active circuit.

112. The charged particle funnel of claim 96, wherein the first, intermediate and last electrodes are connected in series with active component.

113. The charged particle funnel of claim 96, wherein the electric field is shaped such that charged particles traveling through the funnel and having the same mass to charge ratio are all brought substantially into time focus at the target plane downstream of the funnel.

114. The charged particle funnel of claim 96, wherein the series of electrodes is preceded by an ion source and/or followed by a detector.

115. The charged particle funnel of claim 96, wherein the series of electrodes is preceded by an ion source and/or followed by a wafer.

116. An apparatus comprising:
- a series of spaced apart electrodes comprising a first electrode, a last electrode and one or more intermediate electrodes; and
- a voltage source configured to apply a periodic voltage waveform to each electrode independently in a manner so as to form a quasi-electrostatic time varying potential gradient between adjacent electrodes configured to displace charged particles of a beam of charged particles along a direction of propagation of the beam to generate a spatial distribution of the charged particles having a plurality of first regions each having a charged particle density and a plurality of second regions each having substantially no charged particle density.

117. The apparatus of claim 116, wherein the voltage source is further configured to generate a radial shaped electric field configured to displace the charged particles radially to the direction of propagation and to generate an axial time varying electric field changing on a timescale equivalent to a mean transit time of the beam traversing gaps between adjacent electrodes.

118. The apparatus of claim 117, wherein the radial shaped electric field is comprised of a series of variable amplitude and variable shape voltage pulses.

119. The apparatus of claim 116, wherein the periodic voltage waveform applied to each electrode is delayed by a time interval equal to a charged particle transit time between adjacent electrodes.

120. The apparatus of claim 116, wherein the periodic voltage waveform applied to each electrode is delayed by a time interval equal to a harmonic of a charged particle transit time between adjacent electrodes.

121. The apparatus of claim 116, wherein the periodic voltage waveform applied to each electrode is delayed by a time interval equal to a half-tone of a charged particle transit time between adjacent electrodes.

122. The apparatus of claim 116, wherein a frequency of the periodic voltage waveform is equal to a bunch frequency of the beam.

123. The apparatus of claim 116, wherein a frequency of the periodic voltage waveform is equal to a harmonic of a bunch frequency of the beam.

124. The apparatus of claim 116, wherein a frequency of the periodic voltage waveform is a mixed mode signal of a bunch frequency of the beam.

* * * * *